(12) United States Patent
Choe et al.

(10) Patent No.: US 12,610,695 B2
(45) Date of Patent: Apr. 21, 2026

(54) LIGHT EMITTING DISPLAY DEVICE CAPABLE OF PREVENTING SHORT CIRCUIT BETWEEN THE ANODE AND CATHODE

(71) Applicant: LG Display Co., Ltd., Seoul (KR)

(72) Inventors: Dong Cheol Choe, Paju-si (KR); Yoon Sung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 426 days.

(21) Appl. No.: 18/454,631

(22) Filed: Aug. 23, 2023

(65) Prior Publication Data

US 2024/0215327 A1 Jun. 27, 2024

(30) Foreign Application Priority Data

Dec. 21, 2022 (KR) ......................... 10-2022-0180679

(51) Int. Cl.
H10K 59/122 (2023.01)
H10K 59/35 (2023.01)
H10K 59/80 (2023.01)

(52) U.S. Cl.
CPC ........... H10K 59/122 (2023.02); H10K 59/35 (2023.02); H10K 59/80521 (2023.02)

(58) Field of Classification Search
CPC . H10K 59/122; H10K 59/35; H10K 59/80521
See application file for complete search history.

(56) References Cited

U.S. PATENT DOCUMENTS

| | | | |
|---|---|---|---|
| 11,114,649 B2 | 9/2021 | Kim et al. | |
| 2018/0190748 A1* | 7/2018 | Im ......................... | H10K 50/865 |
| 2019/0165326 A1* | 5/2019 | Kim ..................... | H10K 59/122 |
| 2020/0035758 A1* | 1/2020 | Kang ................... | H10K 50/818 |
| 2020/0279894 A1* | 9/2020 | Madigan .............. | H10K 59/122 |
| 2021/0050555 A1* | 2/2021 | Lee .................... | H10K 59/1213 |
| 2023/0329040 A1 | 10/2023 | Jeong et al. | |

FOREIGN PATENT DOCUMENTS

| | | |
|---|---|---|
| GB | 2577379 A | 3/2020 |
| KR | 10-2019-0064051 A | 6/2019 |
| KR | 10-2022-0082457 A | 6/2022 |

* cited by examiner

*Primary Examiner* — Tracie Y Green
(74) *Attorney, Agent, or Firm* — Seed Intellectual Property Law Group LLP

(57) ABSTRACT

Disclosed is a light emitting display device including a substrate, a bank provided on the substrate, the bank being configured to divide a first emissive portion and a second emissive portion from each other, the bank having a trench, a first common layer provided over the first emissive portion, the bank, and the second emissive portion, a first color emissive layer provided on the first common layer in the first emissive portion, a second color emissive layer provided on the first common layer in the second emissive portion, a stack of layers formed by overlapping of a first auxiliary color emissive layer provided on the same layer as the first color emissive layer and a second auxiliary color emissive layer provided on the same layer as the second color emissive layer on the bank including the trench, and a cathode spaced apart from the first common layer by the stack of layers.

24 Claims, 14 Drawing Sheets

(a)                    (b)                    (c)

LIGHT EMITTING DISPLAY DEVICE CAPABLE OF PREVENTING SHORT CIRCUIT BETWEEN THE ANODE AND CATHODE

CROSS-REFERENCE TO RELATED APPLICATION(S)

This application claims the benefit of Korean Patent Application No. 10-2022-0180679, filed on Dec. 21, 2022, which is hereby incorporated by reference as if fully set forth herein.

BACKGROUND

Technical Field

The present disclosure relates to a light emitting display device, and more particularly to a light emitting display device capable of preventing short circuit between a cathode and a layer having high charge mobility in a function portion deposited between an anode and the cathode.

Description of the Related Art

An image display device capable of displaying various kinds of information on a screen is core technology of the information and communication age, and various display devices having excellent performance, including slimness, light weight, and low power consumption, have been continuously developed.

Thereamong, a light emitting display device includes a light emitting element, which is a self-emissive element. As a result, a separate light source used in a non-emissive element is not necessary, and therefore light weight and slimness of the light emitting display device are possible.

The light emitting element includes a functional portion between an anode and a cathode, and an electric field is applied between the anode and the cathode to emit light.

Here, the functional portion may have a plurality of layers, including a common layer and an emissive layer, and the common layer may include a layer that exhibits high charge mobility as needed. In addition, the functional portion may include a plurality of stacks.

Meanwhile, in the light emitting display device, the light emitting element is provided for each subpixel. In the light emitting display device, at least one of layers constituting the light emitting element may be continuous over all of the subpixels in a planar shape.

BRIEF SUMMARY

Accordingly, the present disclosure is directed to a light emitting display device that substantially obviates one or more problems due to limitations and disadvantages of the related art.

In a light emitting display device, leakage current may flow between adjacent subpixels through common layers connected to each other in a planar shape. In the present disclosure, a trench that lengthens a path of current that flows to sides between adjacent subpixels is provided at a bank in order to prevent leakage current between the adjacent subpixels. The present disclosure is directed to providing a light emitting display device configured such that, in a bank structure including a trench, a projecting pattern or stack of layers is provided on the bank in order to prevent short circuit caused due to loss of a common layer at the side and the bottom corner of the trench and a method of manufacturing the same.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, a light emitting display device according to the present disclosure is configured such that a stack of layers is provided between a first common layer and a cathode on a trench, whereby the first common layer and the cathode are electrically spaced apart from each other, and therefore it is possible to prevent short circuit between the cathode and a layer having high charge mobility in a function portion deposited between an anode and the cathode.

A light emitting display device according to an embodiment of the present disclosure includes a substrate, a bank provided on the substrate, the bank being configured to divide a first emissive portion and a second emissive portion from each other, the bank having a trench formed in the surface thereof, a first common layer provided over the first emissive portion, the bank, and the second emissive portion, a first color emissive layer provided on the first common layer in the first emissive portion, a second color emissive layer provided on the first common layer in the second emissive portion, a stack of layers formed by overlapping of a first auxiliary color emissive layer provided on the same layer as the first color emissive layer and a second auxiliary color emissive layer provided on the same layer as the second color emissive layer on the bank including the trench, and a cathode electrically spaced apart from the first common layer by the stack of layers.

It is to be understood that both the foregoing general description and the following detailed description of the present disclosure are exemplary and explanatory and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
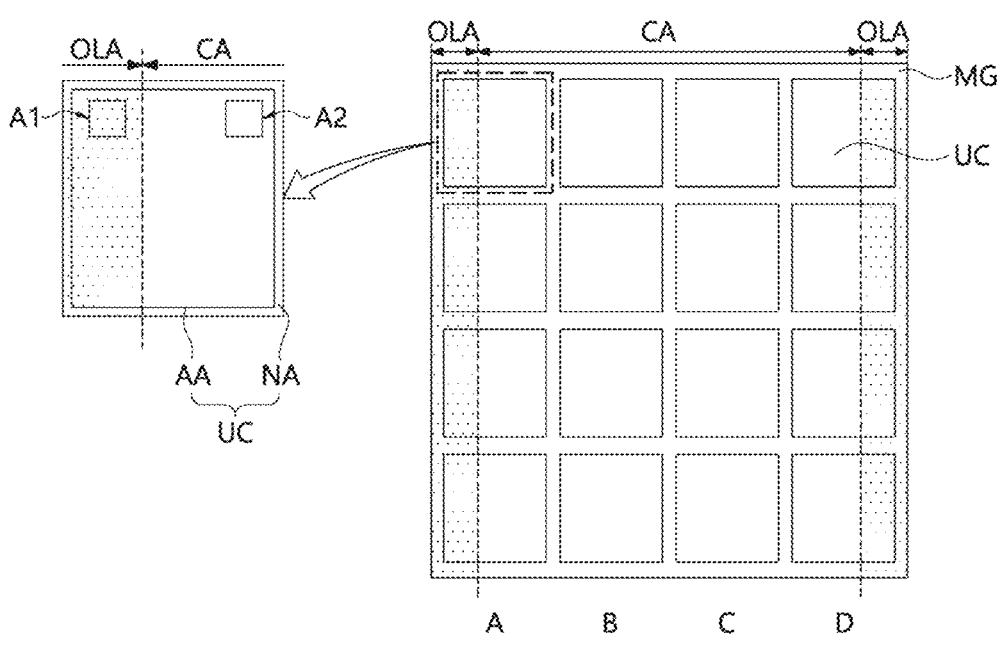
FIG. 1 is a plan view of a substrate used to manufacture a light emitting display device according to the present disclosure.

Advantages and features of the present disclosure and methods of achieving the same will be more clearly understood from embodiments described below with reference to the accompanying drawings. However, the present disclosure is not limited to the following embodiments and may be implemented in various different forms. The embodiments are provided merely to complete the present disclosure and to fully inform a person having ordinary skill in the art to which the present disclosure pertains of the category of the present disclosure. The present disclosure is defined only by the category of the claims.

In the drawings for explaining the exemplary embodiments of the present disclosure, for example, the illustrated shape, size, ratio, angle, and number are given by way of example, and thus, are not limitative of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises," "includes," and "has," used in this specification, do not preclude the presence or addition of other elements unless used along with the term "only." The singular forms are intended to include the plural forms as well, unless the context clearly indicates otherwise.

In the interpretation of constituent elements, the constituent elements are interpreted as including an error range even if there is no explicit description thereof.

When describing positional relationships, for example, when the positional relationship between two parts is described using "on," "above," "below," "beside," or the like, one or more other parts may be located between the two parts unless the term "directly" or "closely" is used therewith.

When the temporal relationship between two actions is described using "after," "subsequently," "next," "before," or the like, the actions may not occur in succession unless the term "immediately" or "directly" is used therewith.

Although the terms "first," "second," etc., may be used to describe various elements, the elements are not limited by the terms. These terms are merely used to distinguish an element from another element. Therefore, a "first element" described hereinafter may be a "second element" within the technical idea of the present disclosure.

The expressions "first horizontal axis direction," "second horizontal axis direction," and "vertical axis direction" must not be interpreted based only on the geometrical relationship therebetween, e.g., the relationship in which the directions are perpendicular to each other, and may mean as having wider directivities within a range within which the construction of the present disclosure is functionally operated.

The expression "at least one" must be interpreted as including all possible combinations selectable from one or more relative items. For example, the expression "at least one of a first item, a second item, and a third item" may mean not only any one of the first item, the second item, and the third item but also all possible combinations of two or more selectable from the first item, the second item, and the third item.

Features of various examples of the present disclosure may be partially or entirely coupled to or combined with each other, various kinds of linkage and driving are technically possible, and the examples may be independently implemented or may be implemented in the state in which the examples are linked with each other.

Hereinafter, preferred embodiments of a light emitting display device according to the present disclosure will be described in detail with reference to the accompanying drawings.

When elements of the drawings are denoted by reference symbols, the same elements may be denoted by the same reference symbols even when they are depicted in different drawings. In addition, the scale of elements shown in the accompanying drawings is different from the actual scale thereof for convenience of description, and therefore the scale of elements is not limited to the scale shown in the drawings.

FIG. 1 is a plan view of a substrate used to manufacture a light emitting display device according to the present disclosure.

Referring to FIG. 1, a plurality of unit cells UC, each of which includes an active area AA constituting a light emitting display device after a scribing process, may be provided on the substrate MG so as to be spaced apart from each other. That is, as shown in FIG. 1, the light emitting display device may have an active area AA and a non-active area NA around the active area AA. The substrate MG may be a glass substrate or a flexible plastic substrate. As an example, the plastic substrate may include polyimide or polyamide.

The plurality of unit cells UC according to the present disclosure may be arranged in a first direction, and the plurality of unit cells arranged in the first direction may be disposed in a second direction perpendicular or transverse to the first direction so as to be included in columns A, B, C, and D. However, the present disclosure is not limited thereto, and the plurality of unit cells UC may have different sizes and may be disposed in various forms.

In the present disclosure, the substrate MG, on which the plurality of unit cells UC is provided, may include outer line areas OLA of columns A and D opposite each other in the first direction and a central area CA between the outer line areas OLA. The central area CA may include columns B and C, and may further include areas of columns A and D excluding the outer line areas OLA.

In addition, each unit cell UC on the substrate MG may be provided with a notch, in which an element, such as a camera or a speaker, is mounted.

Figure 2:
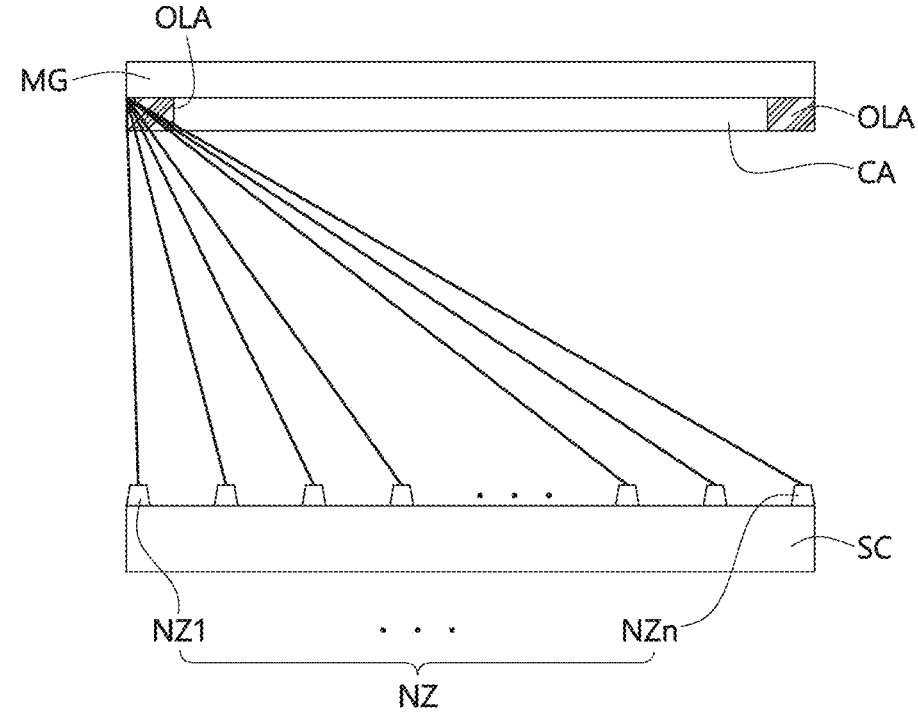
FIG. 2 is a sectional view showing some of a process of manufacturing the light emitting display device according to the present disclosure.

FIG. 2 is a sectional view showing some of a process of manufacturing the light emitting display device according to the present disclosure.

Referring to FIG. 2, a source SC sprayed from nozzles NZ is deposited on the substrate MG. A first nozzle NZ1 to an n-th nozzle NZn are disposed in the second direction of the substrate MG, and spray the source SC while scanning the substrate MG in the first direction.

The amount of the source SC sprayed from the nozzles NZ in a direction perpendicular to the substrate MG in each outer line area OLA is less than the amount of the source SC sprayed from the nozzles NZ in the direction perpendicular to the substrate MG in the central area CA, and most of the source SC is sprayed to the substrate MG in each outer line area OLA in a lateral direction and deposited thereon. As a result, the source SC may be thinly deposited on a structure provided in the active area included in each outer line area OLA due to the occurrence of a shadow between the angle of incidence of the source SC sprayed to the side surface of the structure and the lateral angle of the structure. In particular, for an organic material having poor step coverage, the laterally sprayed source SC may be more thinly deposited than a metal material in the shadow. Here, the structure may be the same element as a bank BK (see FIG. 3A), and the bank BK may have a trench T (see FIG. 3A) configured to prevent leakage current from flowing between adjacent emissive portions.

Figure 3A:
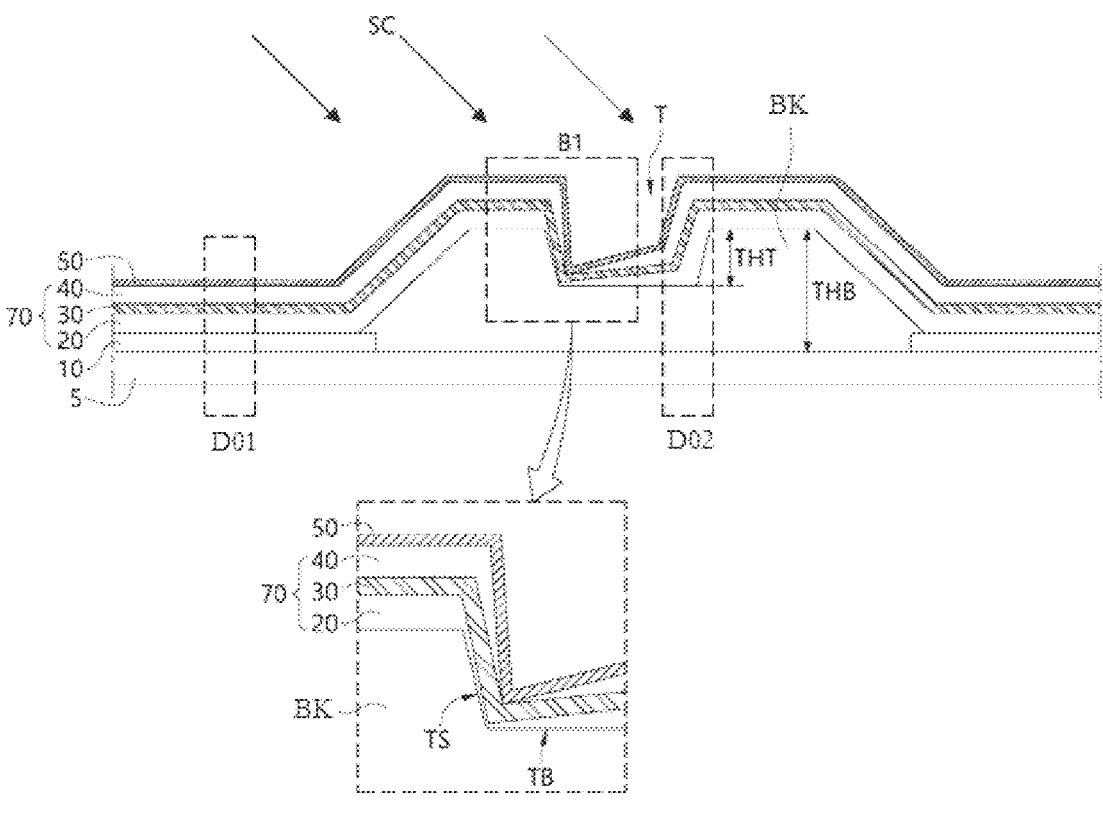
FIG. 3A is a sectional view showing a part of area A1 of FIG. 1.
Figure 3B:
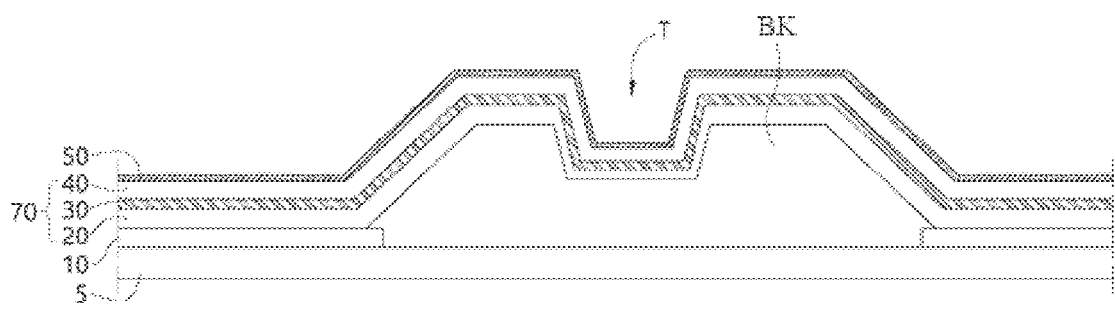
FIG. 3B is a sectional view showing a part of area A2 of FIG. 1.
Figure 3C:
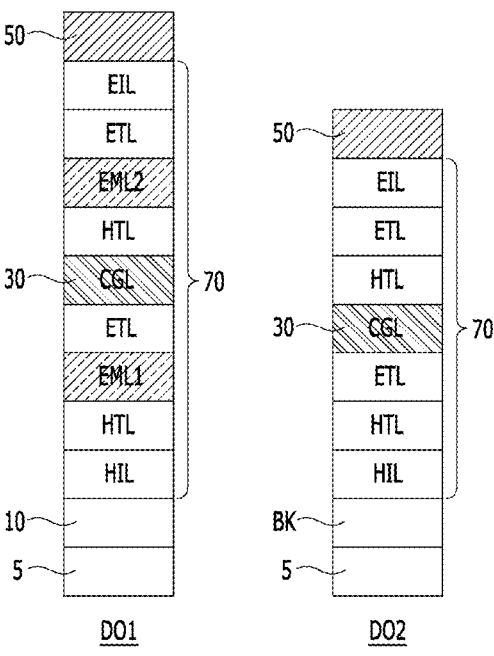
FIG. 3C is a sectional view showing layered structures of areas D01 and D02 of FIG. 3A.

FIGS. 3A to 3C are sectional views showing parts of area A1 and area A2 of FIG. 1. Each of FIGS. 3A and 3B shows the deposited state of the source SC on the structure provided in the outer line area OLA and the central area CA of the substrate MG. FIG. 3C is a sectional view showing layered structures of areas D01 and D02 of FIG. 3A.

Referring to FIGS. 3A and 3B, anodes 10 are provided on a substrate 5 so as to be spaced apart from each other, and a bank BK may be provided while dividing emissive portions of the anodes 10. A functional portion 70 including a first stack 20, a charge generation layer 30, and a second stack 40 and a cathode 50 may be sequentially provided on the anode 10 and the bank BK. In FIG. 3A, which shows the outer line area OLA of the substrate MG, most of the source SC is incident from the side surface of the substrate 5. In FIG. 3B, which shows the central area CA of the substrate MG, most of the source SC is incident in a direction perpendicular to the substrate 5.

Referring to FIG. 3C, the first stack 20 of the functional portion 70 may include a hole injection layer HIL, a hole transport layer HTL1, a lower color emissive layer EML1, and an electron transport layer ETL1, and the second stack 40 of the functional portion 70 may include a hole transport layer HTL2, an upper color emissive layer EML2, an electron transport layer ETL2, and an electron injection layer EIL.

A material included in the functional portion 70 provided between the anode 10 and the cathode 50 is not limited to an organic material. Depending on optical characteristics and electrical characteristics, at least one layer of the functional portion may include an inorganic material or a co-deposited material including an organic material and an inorganic material. Depending on circumstances, an inorganic material may be included in an organic material as 30 wt % or less of a dopant, and an organic material may be included in an inorganic material as 30 wt % or less of a dopant.

The charge generation layer 30 provided between the first stack 20 and the second stack 40 may include an n-type charge generation layer and a p-type charge generation layer. The n-type charge generation layer and the p-type charge generation layer may include an n-type dopant and a p-type dopant, respectively. For example, the n-type dopant may include a metal dopant, such as lithium (Li) or ytterbium (Yb). The metal dopant may increase charge mobility. When the n-type charge generation layer is commonly formed at a plurality of subpixels, therefore, leakage current may flow between adjacent subpixels. In addition to the n-type charge generation layer, layers of the functional portion 70 including a material that exhibits high charge mobility may cause leakage current.

In the light emitting display device according to the present disclosure, a trench T may be provided in the bank BK between adjacent subpixels, whereby a lateral movement path between the adjacent subpixels may be increased, and therefore it is possible to prevent leakage current. Here, a plurality of trenches T may be included in the bank BK, and the thickness THT of the trench T may be less than the thickness THB of the bank BK.

Meanwhile, the side surface TS of the trench T may be more highly tapered than the side surface of the bank BK. When an organic material is deposited, therefore, the amount of the material that is deposited may be less under the same conditions. Also, in the substrate MG, the organic material may not be locally deposited between the side surface TS and the bottom surface TB of the trench T on an outer line distant from the source SC. That is, the functional portion 70 may be sufficiently deposited on the side surface of the bank BK, whereas the functional portion 70 may be very thinly deposited on the side surface TS of the trench steeper than the side surface of the bank BK.

As a result, the thickness of an organic material (the second stack 40 of FIG. 3A) to be provided in a vertical space between the charge generation layer 30 and the cathode 50 may also be reduced, whereby short circuit may occur between the charge generation layer 30 and the cathode 50. When short circuit occurs between the charge generation layer 30 and the cathode 50, electrons from the cathode 50 may be introduced into the charge generation layer 30, and the electrons may flow to an outer part of the anode 10 adjacent thereto, whereby the subpixel adjacent thereto may unnecessarily emit light.

In particular, since the organic material supplied from the source is supplied to the trench T of the bank BK provided in the outer line area OLA of the substrate MG at a small acute angle, the source SC of the organic material may be sufficiently deposited on the side surface laid at an angle opposite the angle of incidence, which is a part of the area of the trench T of the bank BK, such as area D02, whereas the organic material may be very thinly deposited on the side surface (area B1) of the trench T laid in the same direction as the angle of incidence or perpendicular thereto. When the organic material of the second stack 40 is not deposited, short circuit may occur between the charge generation layer 30 and the cathode 50 depending on circumstances. In particular, as shown in FIGS. 1 and 2, the organic material from the source SC is commonly incident on the active area AA in the outer line area OLA of the substrate MG at a small acute angle in a vertical line direction of FIG. 1. As a result, as shown in FIG. 3A, short circuit may continuously occur between the cathode 50 on the emissive layer 70 and the charge generation layer 30 in the emissive layer 70 due to the organic material deposited in the outer line area OLA of the substrate MG, which may be observed through a phenomenon in which linear non-emission occurs.

Meanwhile, as shown in FIG. 3B, a large amount of the source of the organic material of the functional portion 70 is sprayed in a relatively vertical direction at the trench T of the bank BK provided in the central area CA of the substrate MG, whereby the organic material of the functional portion 70 may be uniformly deposited.

Referring to the layered structure of area D01 of FIG. 3C, the functional portion 70 deposited on the emissive portion includes an upper color emissive layer EML2 between the charge generation layer 30 and the cathode 50.

In addition, referring to the layered structure of area D02 of FIG. 3C, the functional portion 70 deposited on the bank BK including the trench T may be constituted by a first stack 20 including a hole injection layer HIL, a hole transport layer HTL1, and an electron transport layer ETL1, a charge generation layer (CGL) 30, and a second stack 40 including a hole transport layer HTL2, an electron transport layer ETL2, and an electron injection layer EIL. As a result, the functional portion 70 deposited on the bank including the trench T does not include an upper color emissive layer EML2 of the second stack between the charge generation layer 30 and the cathode 50, compared to the emissive portion.

In the light emitting display device according to the present disclosure, therefore, even though some of a common layer commonly provided on the emissive portion and the bank BK are not deposited or are insufficiently deposited as the result of the trench T functioning as a defense with respect to the angle of incident of the organic material received from the source SC, the thickness of the functional portion 70 on the bank BK is increased by a plurality of emissive layers deposited on the bank BK before deposition of the cathode 50, whereby short circuit between the cathode 50 and a layer having high charge mobility (the charge generation layer 30 of FIG. 3A), which belongs to the common layer, is prevented.

Figure 4:
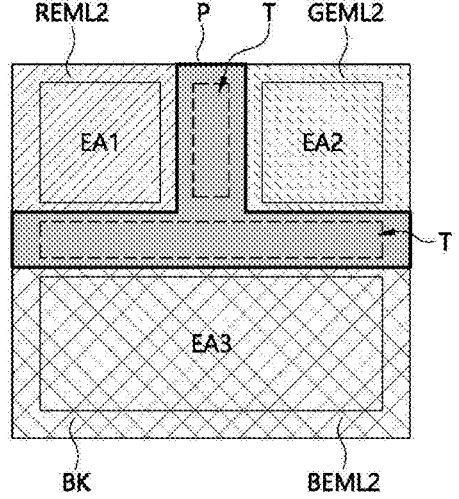
FIG. 4 is a plan view of an embodiment of the light emitting display device according to the present disclosure.

FIG. 4 is a plan view of an embodiment of the light emitting display device according to the present disclosure.

Referring to FIG. 4, first to third emissive portions EA1, EA2, and EA3 may be divided from each other by the bank BK, the first emissive portion EA1 and the second emissive portion EA2 may be disposed side by side, the third emissive portion EA3 may be disposed under the first emissive portion EA1 and the second emissive portion EA2. The first emissive portion EA1 is separated from the second emissive portion EA2. The first to third emissive portions EA1, EA2, and EA3 may emit red light, green light, and blue light, respectively. However, the disposition of the red, green, and blue emissive portions of the present disclosure Is not limited thereto. As an example, blue emissive portions and first green emissive portions may be alternately arranged in a diagonal direction, and second green emissive portions and red emissive portions may be alternately arranged in a diagonal direction parallel to the blue emissive portions and the first green emissive portions.

Since luminous efficacy of blue color is lower than luminous efficacy of red color and green color, the third emissive portion EA3, which is a blue emissive portion, may have a larger area than each of the first emissive portion EA1, which is a red emissive portion, and the second emissive portion EA2, which is a green emissive portion. However, the present disclosure is not limited thereto. Depending on circumstances, the first to third emissive portions EA1, EA2, and EA3 may have various structures and sizes.

The trench T of the bank BK may be provided between the first emissive portion EA1, the second emissive portion EA2, and the third emissive portion EA3. In addition, a plurality of trenches T may be included in the bank BK, and a stack of layers P may be provided on upper surfaces of the trenches T and the bank BK. The trench T of the present disclosure is not limited thereto. The trench may be formed so as to surround each of the first to third emissive portions EA1, EA2, and EA3 depending on circumstances, and may be configured in other different forms.

A first color emissive layer REML2 may cover the first emissive portion EA1, may have a larger area than the first emissive portion EA1, and may be continuous with the stack of layers P. A second color emissive layer GEML2 may cover the second emissive portion EA2, may have a larger area than the second emissive portion EA2, and may be continuous with the stack of layers P. A third color emissive layer BEML2 may cover the third emissive portion EA3, may have a larger area than the third emissive portion EA3, and may be continuous with the stack of layers P.

The stack of layers P may be constituted by two or more auxiliary color emissive layers. Specifically, the auxiliary color emissive layers may include a first auxiliary color emissive layer REM2' continuous with the first color emissive layer REML2, a second auxiliary color emissive layer GEML2' continuous with the second color emissive layer GEML2, and a third auxiliary color emissive layer BEML2' continuous with the third color emissive layer BEML2.

The stack of layers P of the present disclosure is not limited to the three auxiliary color emissive layers. Depending on circumstances, the stack of layers P may be constituted by two auxiliary color emissive layers or three or more auxiliary color emissive layers, as in the following embodiments (first to third embodiments). The stack of layers P may be discontinuous with an upper color emissive layer of the emissive portion adjacent thereto.

In addition, the stack of layers P may be partially provided on the upper surface of the bank BK while covering the trench T between the first to third emissive portions EA1, EA2, and EA3. Consequently, the stack of layers P may completely cover the trench T at the structure of the bank BK vulnerable to deposition, whereby the vertical distance between the upper construction and the lower construction of the stack of layers P may be increased.

Alternatively, the device may be described as including the bank between the first emissive portion and the second emissive portion. A first emissive layer of a first color may be formed in the first emissive portion EA1. A second emissive layer of a second color may be formed in the second emissive portion EA2. A third emissive layer REML2' of the first color may be formed in the trench. A fourth emissive layer GEML2' of the second color may be formed in the trench. A fifth emissive layer BEML2' of a third color may be formed in the trench, on the fourth emissive layer. The first emissive layer is spaced from the substrate by a first dimension in a first direction (vertical in the Figure) and the third emissive layer is spaced from the substrate by a second dimension in the first direction, the first dimension being smaller than the second dimension. The fourth emissive layer is in direct contact with the third emissive layer. The fifth emissive layer is in direct contact with the fourth emissive layer.

The projection portion may be referred to as a stack of a plurality of emissive layers on the bank and in the trench, the stack of the plurality of emissive layers including at least one layer of the first color REML2'. The stack of the plurality of emissive layers includes at least one layer of the second color, GEML2'. The stack of the plurality of emissive layers includes at least one layer of a third color BEML2' that is different from the first color and the second color.

Figure 5:
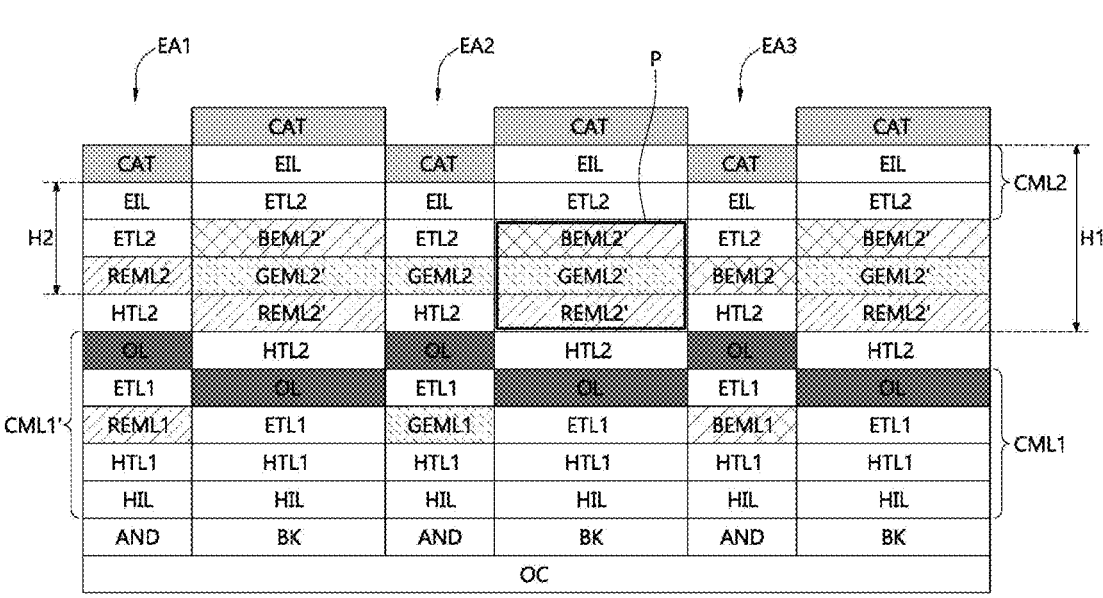
FIG. 5 is a sectional view schematically showing a layered structure for each area of the light emitting display device according to the present disclosure.

FIG. 5 is a sectional view schematically showing a layered structure for each area of the light emitting display device according to the present disclosure.

Referring to FIG. 5, the light emitting display device according to the present disclosure may include a first emissive portion EA1, a second emissive portion EA2, and a third emissive portion EA3 having different emissive layers, and may include a bank BK configured to divide the emissive portions EA1, EA2, and EA3 from each other. The first to third emissive portions EA1, EA2, and EA3 may emit red light, green light, and blue light, respectively; however, the present disclosure is not limited thereto.

The emissive layer may be provided between an anode AND and a cathode CAD, and may include a first stack, a second stack, and a charge generation layer OL between the first stack and the second stack. A common layer of the first stack may include a hole injection layer HIL, a lower hole transport layer HTL1, and a lower electron transport layer ETL1, and a common layer of the second stack may include an upper hole transport layer HTL2, an upper electron transport layer ETL2, and an electron injection layer EIL. In addition, the charge generation layer OL between the first stack and the second stack may be provided as a common layer.

Here, color emissive layers REML, GEML, and BEML may be differently formed for each area. Specifically, the first stacks of the first to third emissive portions EA1, EA2, and EA3 may include a lower first color emissive layer REML1, a lower second color emissive layer GEML1, and a lower third color emissive layer BEML1, respectively. The second stacks of the first to third emissive portions EA1, EA2, and EA3 may include an upper first color emissive layer REML2, an upper second color emissive layer GEML2, and an upper third color emissive layer BEML2, respectively. The lower first color emissive layer REML1 and the upper first color emissive layer REML2 may be the same color emissive layers, e.g., red emissive layers, the lower second color emissive layer GEML1 and the upper second color emissive layer GEML2 may be the same color emissive layers, e.g., green emissive layers, and the lower third color emissive layer BEML1 and the upper third color emissive layer BEML2 may be the same color emissive layers, e.g., blue emissive layers.

At the second stack on the bank BK, a first auxiliary color emissive layer REML2' on the same layer as the first color emissive layer REML2, a second auxiliary color emissive layer GEML2' on the same layer as the second color emissive layer GEML2, and a third auxiliary color emissive layer BEML2' on the same layer as the third color emissive layer BEML2 may overlap each other.

At the bank BK including the trench T (see FIG. 6), therefore, the second stack may further include a stack of layers having a structure in which the first to third auxiliary color emissive layer REML2', GEML2' and BEML2' overlap each other, compared to the first to third emissive portions EA1, EA2, and EA3. That is, the distance between the hole transport layer HTL1 and the cathode CAT of the present disclosure is configured such that the first height H1 at the bank BK is greater than the second height H2 in each of the first to third emissive portions EA1, EA2, and EA3. In the present disclosure, therefore, the first to third auxiliary color emissive layer REML2', GEML2' and BEML2' may function as a stack of layers at the bank BK including the trench T, whereby the first common layer CML and the cathode CAT may be electrically spaced apart from each other.

In the light emitting display device according to the present disclosure, therefore, a first common layer CML1 including the hole injection layer HIL, the hole transport layer HTL1, the electron transport layer ETL1, and the charge generation layer OL may be provided on the bank BK, and a first common layer CML1' including the hole injection layer HIL, the hole transport layer HTL1, the first color emissive layer REML1, the electron transport layer ETL1, and the charge generation layer OL may be provided on the anode AND. Meanwhile, a second common layer CML2 including the electron transport layer ETL2 and the electron injection layer EIL may be provided on each of the bank BK and the anode AND.

Figure 6:
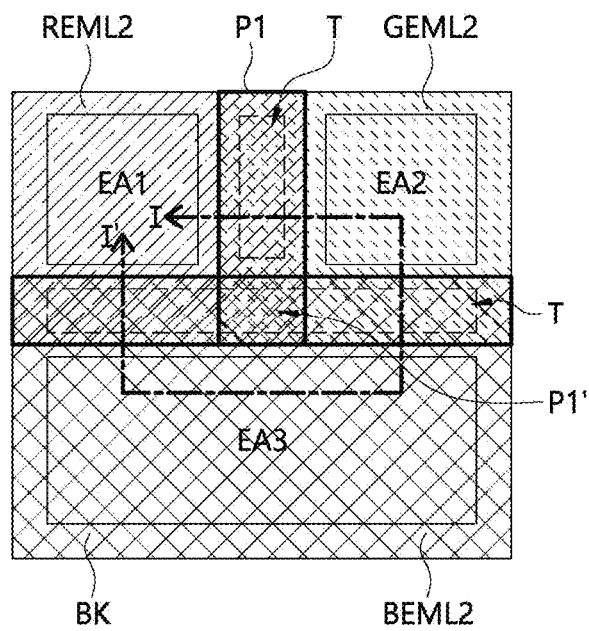
FIG. 6 is a plan view of a light emitting display device according to a first embodiment of the present disclosure.
Figure 7:
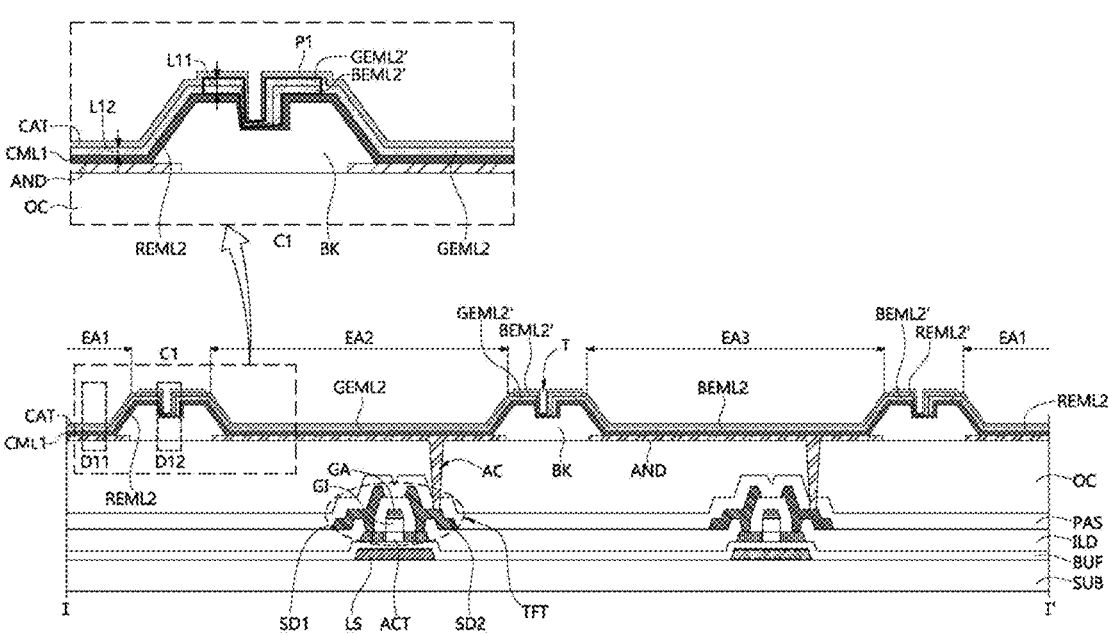
FIG. 7 is a sectional view taken along line I-I' of FIG. 6.
Figure 8:
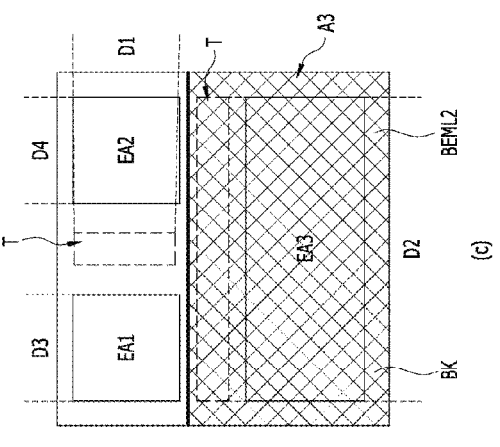
FIG. 8 is a view showing an area of each color emissive layer of FIG. 6.
Figure 8:
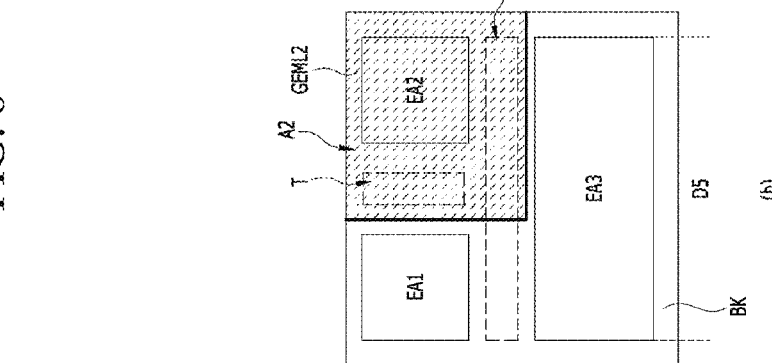
Figure 8:
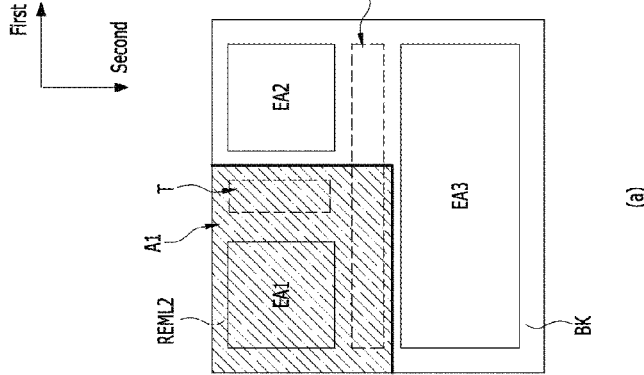

FIG. 6 is a plan view of a light emitting display device according to a first embodiment of the present disclosure, FIG. 7 is a sectional view taken along line I-I' of FIG. 6, and FIG. 8 is a view showing an area of each color emissive layer of FIG. 6. In the first embodiment, a stack of layers may be constituted by two auxiliary color emissive layers. In addition, a hole transport layer HTL2 and a second common layer CML2 on a first common layer CML1 of a functional portion EL between an anode AND and a cathode CAT are omitted from FIG. 7. Here, the first common layer CML1 may further include one emissive layer on the anode AND rather than on a bank BK; however, a single common layer CML1 may be provided for convenience of description.

As shown in FIG. 7, the light emitting display device according to the first embodiment of the present disclosure may include a substrate SUB, a thin film transistor TFT, a shielding layer LS, a buffer film BUF, an interlayer dielectric ILD, a passivation layer PAS (or a protective layer), and an overcoat layer OC (or a planarization layer), and may include a light emitting element including an anode AND, a functional portion EL, and a cathode CAT and a bank BK on the overcoat layer OC.

The substrate SUB is divided into a display area, in which an image is displayed, and a non-display area, in which no image is displayed. The display area includes a plurality of emissive portions and a non-emissive portion other than the emissive portions. Here, the substrate SUB may be a glass substrate or a flexible plastic substrate. As an example, the plastic substrate may include polyimide or polyamide. In addition, a circuit element including various signal lines, such as data signal lines and gate signal lines, transistors, such as a switching thin film transistor and a driving thin film transistor, and a capacitor is formed for each emissive portion on the substrate SUB. In the present disclosure, an arbitrary thin film transistor TFT configured to drive an emissive portion is shown for convenience of description.

The thin film transistor TFT includes an active layer ACT, a gate electrode GA overlapping a channel area of the active layer ACT via a gate insulation film GI, and a source electrode SD1 and a drain electrode SD2 connected to both sides of the active layer ACT.

A source area and a drain area are provided at both sides of the active layer ACT of the thin film transistor TFT in the state in which the channel area is located therebetween. Each of the source area and the drain area is formed of a semiconductor material doped with an n-type or p-type dopant. The channel area overlapping the gate electrode GA may be formed of a semiconductor material doped with no n-type or p-type dopant.

The gate electrode GA of the thin film transistor TFT overlaps the channel area of the active layer ACT so as to have the same width in the state in which the gate insulation film GI is located therebetween. The gate insulation film GI overlaps the channel area of the active layer ACT in the same pattern as the gate electrode GA. For example, the gate electrode GA may have a single layer structure or a multi-layer structure made of any one of molybdenum (Mo), aluminum (Al), chromium (Cr), gold (Au), titanium (Ti), nickel (Ni), neodymium (Nd), and copper (Cu) or an alloy thereof. Meanwhile, the gate insulation film GI may be made of an inorganic insulation material. For example, the gate insulation film GI may be constituted by a silicon oxide film (SiOx), a silicon nitride film (SiNx), a silicon oxynitride film (SiOxNy), or a multilayer film thereof.

The shielding layer LS is disposed on the substrate SUB to overlap at least the channel area of the active layer ACT of the thin film transistor TFT. The shielding layer LS is disposed under the active layer ACT. The shielding layer LS prevents external light from penetrating the substrate SUB and reaching the thin film transistor TFT. For example, the shielding layer LS may have a single metal layer structure made of molybdenum (Mo), titanium (Ti), aluminum-neodymium (AlNd), aluminum (Al), chromium (Cr), or an alloy thereof or a multilayer structure using the same.

The buffer film BUF is disposed on the substrate SUB including the shielding layer LS, and the buffer film BUF is configured to cover the shielding layer LS. For example, the buffer film BUF may have a single layer structure or a multilayer structure made of silicon oxide (SiOx) or silicon nitride (SiNx).

The interlayer dielectric ILD is disposed on the buffer film BUF including the active layer ACT of the thin film transistor TFT. The interlayer dielectric ILD may include a source contact hole and a drain contact hole, through which the source area and the drain area of the active layer ACT are exposed, respectively. The interlayer dielectric ILD may be configured to cover the gate insulation film GI and the gate electrode GA. For example, the interlayer dielectric ILD may be made of an inorganic insulation material. For example, the interlayer dielectric ILD may be constituted by a silicon oxide film (SiOx), a silicon nitride film (SiNx), a silicon oxynitride film (SiOxNy), or a multilayer film thereof.

The source electrode SD1 and the drain electrode SD2 may be provided on the interlayer dielectric ILD as the same layer. The source electrode SD1 and the drain electrode SD2 are connected to the source area and the drain area of the active layer ACT through the source contact hole and the drain contact hole, respectively. For example, when each of the source electrode SD1 and the drain electrode SD2 is a single layer, each of the source electrode SD1 and the drain electrode SD2 may be made of any one selected from the group consisting of molybdenum (Mo), aluminum (Al), chromium (Cr), gold (Au), titanium (Ti), nickel (Ni), neodymium (Nd), and copper (Cu) or an alloy thereof.

The passivation layer PAS is disposed on the interlayer dielectric ILD. The passivation layer PAS may be configured to cover the thin film transistor TFT. As a result, the thin film transistor TFT may be protected by the passivation layer PAS. For example, the passivation layer PAS, which is a kind of inorganic dielectric, may be constituted by a single layer made of a silicon oxide film (SiOx), a silicon nitride film (SiNx), or a silicon oxynitride film (SiOxNy) or a multilayer film thereof.

The overcoat layer OC may be provided on the passivation layer PAS. Depending on circumstances, the passivation layer PAS may be omitted when the overcoat layer OC has a function of protecting the thin film transistor TFT. The passivation layer PAS and the overcoat layer OC may have an anode contact hole AC through which the drain electrode SD2 of the thin film transistor TFT is exposed. For example, the overcoat layer OC, which is a kind of organic dielectric, may be made of any one of photo acrylic, polyimide, benzocyclobutene resin, and acrylate. Depending on circumstances, the overcoat layer OC may be formed so as to have a multilayer structure.

A plurality of anodes AND are provided on the overcoat layer OC and are connected to each of the drain electrode SD2 via the anode contact hole AC. The plurality of anodes AND may include a first emissive portion EA1, a second emissive portion EA2, and a third emissive portion EA3, which emit light, divided from each other by the bank BK. Here, the first emissive portion EA1, the second emissive portion EA2, and the third emissive portion EA3 may emit red light, green light, and blue light, respectively.

The bank BK is provided with a trench T, from which a part of the surface of the bank BK is removed. The side surface of the trench T of the bank BK may be steeper than the side surface of the bank BK in order to increase a current movement path. As a result, the functional portion EL, which is made of an organic material, may be sufficiently deposited on the side surface of the bank BK, whereas the organic material may be very thinly deposited or hardly deposited on the side surface of the trench T due to occurrence of a shadow between the angle of incidence of the sprayed source SC and the lateral angle of the trench T.

The first common layer CML1 is provided over the first emissive portion EA1, the second emissive portion EA2, the third emissive portion EA3, and the bank BK between the emissive portions EA1, EA2, and EA3. A first color emissive layer REML2, a second color emissive layer GEML2, and a third color emissive layer BEML2 are provided on the first common layers CML1 of the first emissive portion EA1, the second emissive portion EA2, and the third emissive portion EA3, respectively. The cathode CAT is provided on each of the first to third emissive portions EA1, EA2, and EA3 including the first to third color emissive layers REML2, GEML2, and BEML2, respectively.

FIG. 8 can be represented by three emissive portions on a substrate. A first emissive portion EA1 is on the substrate. There is a second emissive portion EA2 on the substrate that is spaced from the first emissive portion by a bank. There is a third emissive portion EA3 on the substrate. The bank includes a first trench that separates the first emissive portion from the second emissive portion along a first direction. The bank has a second trench that separates the first emissive portion from the third emissive portion along a second direction that is transverse to the first direction. The second trench separates the second emissive portion from the third emissive portion along the second direction.

The first direction may be at a right angle or other angles with respect to the second direction. The first trench is substantially perpendicular to the second trench in at least one embodiment. The first trench includes a first dimension D1 along the second direction. The second trench includes a second dimension D2 along the first direction. The first dimension D1 is less than the second dimension D2.

A first area A1 includes the first emissive portion, all of first trench, and a first part of the second trench. A second area A2 includes the second emissive portion, all of the first trench, and a second part of the second trench that overlaps the first part of the second trench. A third area includes the third emissive portion and all of the second trench. A first emissive layer REML2 is overlapping the first area. A second emissive layer GEML2 overlapping the second area. A third emissive layer BEML2 overlapping the third area. The first emissive portion has a third dimension D3 along the first direction and the second emissive portion has a fourth dimension D4 along the first direction, the second dimension D2 being greater than the third dimension D3, and the second dimension D2 being greater than the fourth dimension D4. The third emissive portion includes a fifth dimension D5 along the first direction, the fifth dimension being substantially similar to the second dimension.

Figure 9:
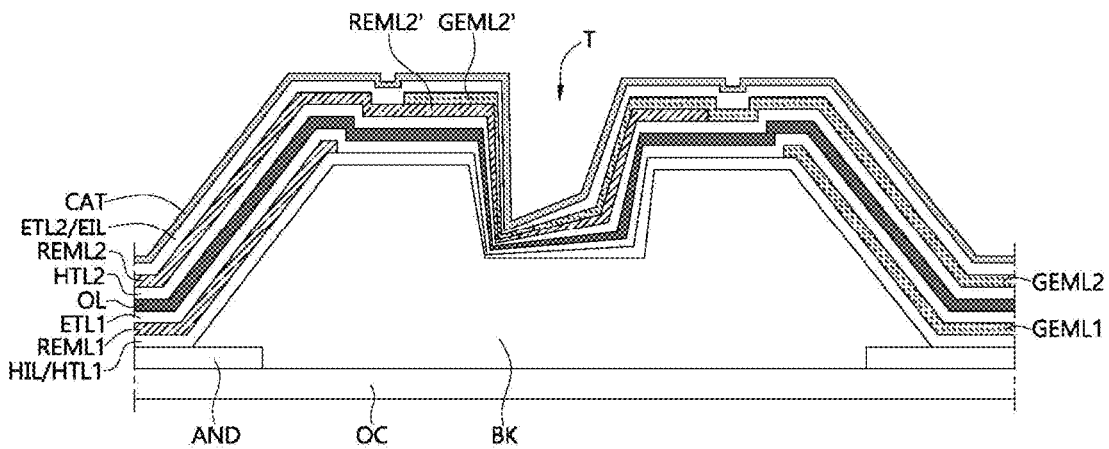
FIG. 9 is an enlarged view of area C1 of FIG. 7.
Figure 10:
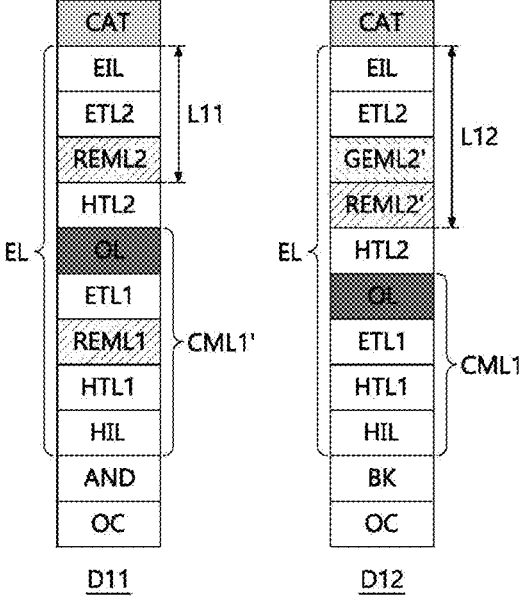
FIG. 10 is a sectional view showing layered structures of areas D11 and D12 of FIG. 7.

Referring to FIGS. 9 and 10, a charge generation layer OL of the first common layer CML1, which is a charge generation layer CGL, may be configured in an n-type and p-type dual layer doped with a dopant such that electrons and holes are easily movable. That is, the charge generation layer OL exhibits excellent current movement characteristics, whereby short circuit may occur when the charge generation layer OL is connected to the cathode CAT. However, the charge generation layer OL of the present disclosure is not limited thereto. The charge generation layer OL may be made of a material that higher charge mobility than at least one hole transport layer HTL1 and at least one electron transport layer ETL1 of the first stack.

Referring to FIGS. 7 and 8, the first color emissive layer REML2 of the first emissive portion EA1 may extend from the first emissive portion EA1 to the bank BK to cover a part of the trench T adjacent thereto. Similarly, each of the second color emissive layer GEML2 of the second emissive portion EA2 and the third color emissive layer BEML2 of the third emissive portion EA3 may extend from each of the second emissive portion EA2 and the third emissive portion EA3 to the bank BK to cover a part of the trench T adjacent thereto.

Consequently, the first color emissive layer REML2 extending from the first emissive portion EA1 and the second color emissive layer GEML2 extending from the second emissive portion EA2 may overlap each other on the bank BK including the trench T to constitute a stack of layers P1. In addition, the second color emissive layer GEML2 extending from the second emissive portion EA2 and the third color emissive layer BEML2 extending from the third emissive portion EA3 may overlap each other on the bank BK including the trench T to constitute a stack of layers P1. Similarly, the third color emissive layer BEML2 extending from the third emissive portion EA3 and the first color emissive layer REML2 extending from the first emissive portion EA1 may overlap each other on the bank BK including the trench T to constitute a stack of layers P1.

Also, a three-layered stack of layers P1' formed by overlapping of the first color emissive layer REML2, the second color emissive layer GEML2, and the third color emissive layer BEML2 may be further provided in the first embodiment, in the stack of layers P1. Here, the stack of layers P1' in the stack of layers P1 is not limited thereto, and the stack of layers P1' may be constituted by two of the first to third color emissive layers REML2, GEML2, and BEML2.

The first color emissive layer REML2, the second color emissive layer GEML2, and the third color emissive layer BEML2 of the stack of layers P1 may be defined as a first auxiliary color emissive layer REML2', a second auxiliary color emissive layer GEML2', and a third auxiliary color emissive layer BEML2', respectively. Consequently, a stack of layers P1 formed by overlapping of two of the first auxiliary color emissive layer REML2', the second auxiliary color emissive layer GEML2', and the third auxiliary color emissive layer BEML2' may be provided on the first common layer CML on the bank BK including the trench T.

Specifically, the stack of layers P1 between the first and second emissive portions EA1 and EA2 may have a layered structure of the first auxiliary color emissive layer REML2' and the second auxiliary color emissive layer GEML2', the stack of layers P1 between the second and third emissive portions EA2 and EA3 may have a layered structure of the second auxiliary color emissive layer GEML2' and the third auxiliary color emissive layer BEML2', and the stack of layers P1 between the third and first emissive portions EA3 and EA1 may have a layered structure of the third auxiliary color emissive layer BEML2' and the first auxiliary color emissive layer REML2'. The layered stack of layers P1 may be formed as the result of the two auxiliary color emissive layers contacting each other while overlapping each other.

The stack of layers P1 may be constituted by auxiliary color emissive layers on the same layers as upper color emissive layers of adjacent two of the first to third emissive portions EA1, EA2, and EA3. In addition, the two auxiliary color emissive layers of the stack of layers P1 may be made of the same organic materials as the color emissive layers continuous therewith.

Next, areas C1, D11, and D12 of FIG. 7 will be described in detail with reference to FIGS. 9 and 10.

Referring to FIGS. 9 and 10, a functional portion EL is provided between the anode AND and the cathode CAT. A common layer of the functional portion EL, i.e., a hole injection layer HIL, a lower hole transport layer HTL1, a lower electron transport layer ETL1, a charge generation layer OL, an upper hole transport layer HTL2, an upper electron transport layer ETL2, and an electron injection layer EIL, is provided over the first emissive portion EA1, the bank BK, and the second emissive portion EA2.

The first emissive portion EA1 may include a lower first color emissive layer REML1 on the hole transport layer HTL1. The lower first color emissive layer REML1 of the first emissive portion EA1 may extend from the first emissive portion EA1 to the side surface of the bank BK adjacent thereto on the anode AND exposed by the bank BK, whereby the lower first color emissive layer REML1 of the first emissive portion EA1 may extend to the edge of the upper surface of the bank BK.

In addition, the first emissive portion EA1 may include an upper first color emissive layer REML2 on the hole transport layer HTL2. The upper first color emissive layer REML2 of the first emissive portion EA1 may extend from the first emissive portion EA1 to the side surface of the bank BK adjacent thereto on the anode AND exposed by the bank BK so as to be continuous with the first auxiliary color emissive layer REML2' on the bank BK.

The second emissive portion EA2 may include a lower second color emissive layer GEML1 on the hole transport layer HTL1. The lower second color emissive layer GEML1 of the second emissive portion EA2 may extend from the second emissive portion EA2 to the side surface of the bank BK adjacent thereto on the anode AND exposed by the bank BK, whereby the lower second color emissive layer GEML1 of the second emissive portion EA2 may extend to the edge of the upper surface of the bank BK.

In addition, the second emissive portion EA2 may include an upper second color emissive layer GEML2 on the hole transport layer HTL2. The upper second color emissive layer GEML2 of the second emissive portion EA2 may extend from the second emissive portion EA2 to the side surface of the bank BK adjacent thereto on the anode AND exposed by the bank BK so as to be continuous with the second auxiliary color emissive layer GEML2' on the bank BK.

The stack of layers P1 on the bank BK may have a structure in which the first auxiliary color emissive layer REML2' continuous with the first color emissive layer REML2 and the second auxiliary color emissive layer GEML2' continuous with the second color emissive layer GEML2 overlap each other. In addition, the first auxiliary color emissive layer REML2' and the second auxiliary color emissive layer GEML2' of the stack of layers P1 may contact each other. As a result, the stack of layers P1 may be provided between the upper hole transport layer HTL2 and the upper electron transport layer ETL2, and may space the first common layer CML1 and the cathode CAT apart from each other in a vertical direction.

Also, in the first embodiment, the first to third emissive portions EA1, EA2, and EA3 include first to third color emissive layers REML2, GEML2, and BEML2 on the first common layers CML1, respectively. Compared to the emissive portions EA1, EA2, and EA3, the bank BK including the trench T includes two of the first to third auxiliary color emissive layers REML2', GEML2', and BEML2' on the first common layer CML1. That is, the bank BK may further include an auxiliary color emissive layer between the first common layer CML1 and the cathode CAT as the stack of layers P1, compared to each of the emissive portions EA1, EA2, and EA3. Consequently, at least the first vertical distance L11 from the lower surface of the stack of layers P1 located at the upper surface of the bank BK to the lower surface of the cathode CAT may be greater than the second vertical distance L12 from the lower surface of the cathode CAT to the lower surface of the first color emissive layer REML2 in the first emissive portion EA1.

Each of the first to third auxiliary color emissive layers REML2', GEML2', and BEML2' included in the stack of layers P1 is made of an organic material, whereby the step coverage characteristics thereof are not good, and therefore each of the first to third auxiliary color emissive layers REML2', GEML2', and BEML2' may have a small thickness at the trench T. However, the first to third auxiliary color emissive layers REML2', GEML2', and BEML2', each of which is thin, are layered to constitute a single stack of layers P1, whereby the first common layer CML1 and the cathode CAT may be electrically spaced apart from each other.

Furthermore, the stack of layers P1 may extend to the lower surface of the trench T of the bank BK, the side surface of the trench T facing the upper part of the edge of the bottom surface, and the upper surface of the bank BK. In the present disclosure, therefore, the functional portion EL having poor step coverage may further have the distance corresponding to the stack of layers P1 between the first common layer CML1 and the cathode CAT at the trench T vulnerable to deposition, whereby it is possible to prevent short circuit between the first common layer CML1 and the cathode CAT at the trench T.

Although, in the first embodiment, the first and second color emissive layers REML2 and GEML2 of the first and second emissive portions EA1 and EA2 are continuous with the stack of layers P1, the first and second color emissive layers REML2 and GEML2 may be discontinuous with the stack of layers P1 depending on circumstances.

Figure 11:
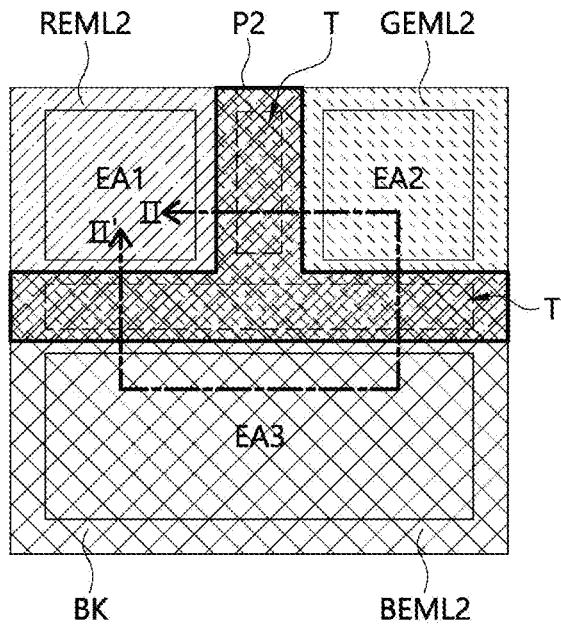
FIG. 11 is a plan view of a light emitting display device according to a second embodiment of the present disclosure.
Figure 12:
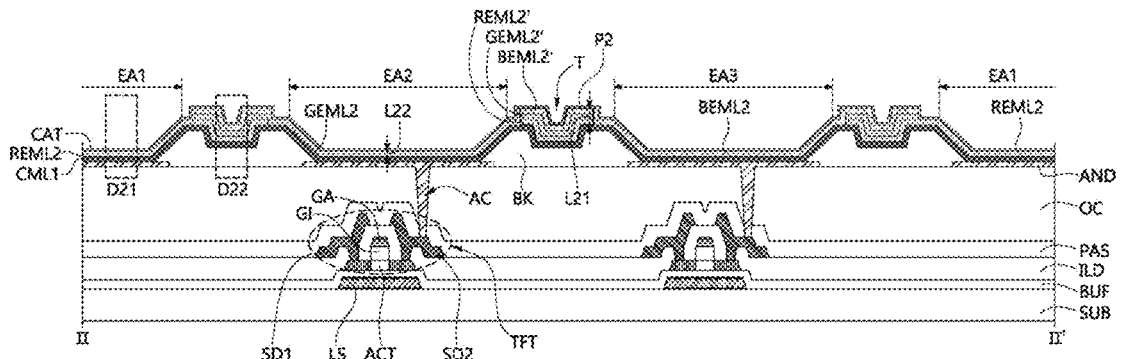
FIG. 12 is a sectional view taken along line II-II' of FIG. 11.
Figure 13:
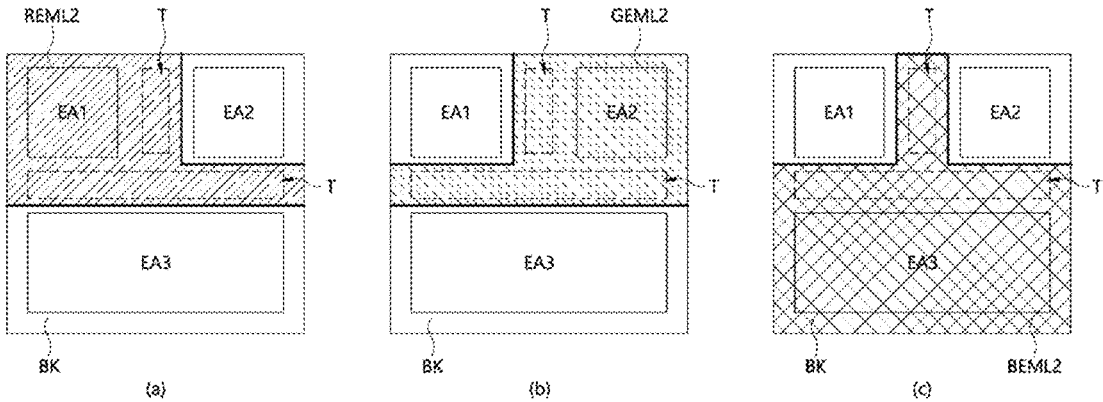
FIG. 13 is a view showing an area of each color emissive layer of FIG. 11.

FIG. 11 is a plan view of a light emitting display device according to a second embodiment of the present disclosure, FIG. 12 is a sectional view taken along line II-II' of FIG. 11, and FIG. 13 is a view showing an area of each color emissive layer of FIG. 11. In the second embodiment, a stack of layers P2 is constituted by three auxiliary color emissive layers. A description of the construction of the second embodiment identical to the construction of the first embodiment will be omitted, and a hole transport layer HTL2 and a second common layer CML2 on a first common layer CML1 of a functional portion EL between an anode AND and a cathode CAT are omitted from FIG. 12.

In the second embodiment of the present disclosure, most of an organic material source is deposited on a trench T in a vertical direction, whereby the organic material is uniformly deposited on the bottom surface and the side surface of the trench T, compared to the first embodiment. However, the second embodiment is not limited to FIG. 12, and most of the organic material source may be deposited on the trench T in a lateral direction, whereby the organic material may be thinly deposited on the bottom surface and the side surface of the trench T in a shadow area.

Also, in the second embodiment of the present disclosure, the stack of layers P2 has a layered structure of a first auxiliary color emissive layer REML2', a second auxiliary color emissive layer GEML2', and a third auxiliary color emissive layer BEML2', compared to the first embodiment. The first auxiliary color emissive layer REML2', the second auxiliary color emissive layer GEML2', and the third auxiliary color emissive layer BEML2' may be continuous with a first color emissive layer REML2 on a first emissive portion EA1, a second color emissive layer GEML2 on a second emissive portion EA2, and a third color emissive layer BEML2 on a third emissive portion EA3, respectively.

Referring to FIGS. 11 and 13, the first color emissive layer REML2 of the first emissive portion EA1 may extend from the first emissive portion EA1 to a bank BK to cover the entirety of the trench T adjacent thereto and the trench T between the second emissive portion EA2 and the third emissive portion EA3. Similarly, each of the second color emissive layer GEML2 of the second emissive portion EA2 and the third color emissive layer BEML2 of the third emissive portion EA3 may extend from each of the second emissive portion EA2 and the third emissive portion EA3 to the bank BK to cover the entirety of the trench T adjacent thereto.

Consequently, the first color emissive layer REML2, the second color emissive layer GEML2, and third color emissive layer BEML2 may extend from the first emissive portion EA1, the second emissive portion EA2, and the third emissive portion EA3, respectively, and may overlap each other at the trench T adjacent thereto to constitute a stack of layers P2.

The first color emissive layer REML2, the second color emissive layer GEML2, and the third color emissive layer BEML2 of the stack of layers P2 may be defined as a first auxiliary color emissive layer REML2', a second auxiliary color emissive layer GEML2', and a third auxiliary color emissive layer BEML2', respectively. Consequently, the stack of layers P2 according to the second embodiment may be continuous with each of the first to third color emissive layers REML2, GEML2, and BEML2.

In addition, the stack of layers P2 according to the second embodiment is continuous with the emissive portion adjacent thereto. Specifically, in the stack of layers P2 between the first and second emissive portions EA1 and EA2, the first auxiliary color emissive layer REML2' and the second auxiliary color emissive layer GEML2' are continuous with the first color emissive layer REML2 and the second color emissive layer GEML2, respectively, when viewed in section. Between the first and second emissive portions EA1 and EA2, the third auxiliary color emissive layer BEML2' is also continuous with the third color emissive layer BEML2, which is shown in the plan view of FIG. 13, not the sectional view of FIG. 12.

In the stack of layers P2 between the second and third emissive portions EA2 and EA3, the second auxiliary color emissive layer GEML2' and the third auxiliary color emissive layer BEML2' are continuous with the second color emissive layer GEML2 and the third color emissive layer BEML2, respectively, when viewed in section. Between the second and third emissive portions EA2 and EA3, the first auxiliary color emissive layer REML2' is also continuous with the first color emissive layer REML2, which is shown in the plan view of FIG. 13, not the sectional view of FIG. 12.

In the stack of layers P2 between the third and first emissive portions EA3 and EA1, the third auxiliary color emissive layer BEML2' and the first auxiliary color emissive layer REML2' are continuous with the third color emissive layer BEML2 and the first color emissive layer REML2, respectively, when viewed in section. Between the third and first emissive portions EA3 and EA1, the second auxiliary color emissive layer GEML2' is also continuous with the second color emissive layer GEML2, which is shown in the plan view of FIG. 13, not the sectional view of FIG. 12.

In addition, the stack of layers P2 according to this embodiment may have a structure in which the first auxiliary color emissive layer REML2', the second auxiliary color emissive layer GEML2', and the third auxiliary color emissive layer BEML2' are sequentially layered according to the manufacturing order. However, the present disclosure is not limited thereto. In the structure in which the first to third auxiliary color emissive layers REML2', GEML2', and BEML2' are layered, the third auxiliary color emissive layer BEML2' may contact the first auxiliary color emissive layer REML2' or the second auxiliary color emissive layer GEML2' according to the manufacturing order.

In addition, the stack of layers P2 may be provided on a part of the upper surface of the bank BK while covering the trench T between the first to third emissive portions EA1, EA2, and EA3. Consequently, the stack of layers P2 may completely cover the trench T vulnerable to deposition, whereby it is possible to prevent short circuit between the cathode CAT on the stack of layers P2 and the first common layer CML1 under the stack of layers P2.

Figure 14:
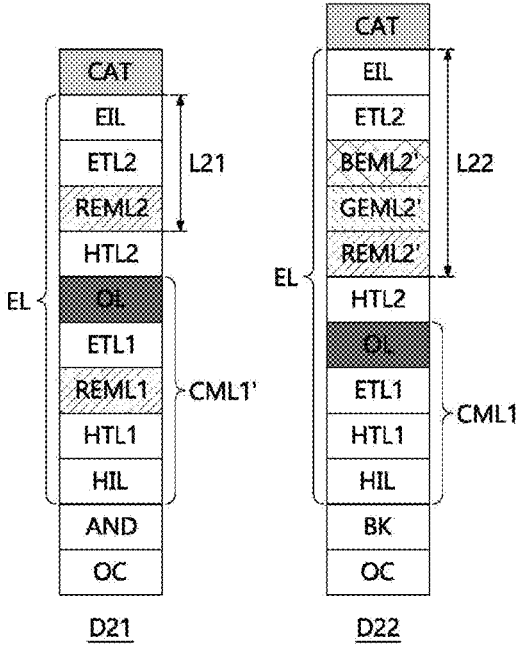
FIG. 14 is a sectional view showing layered structures of areas D21 and D22 of FIG. 12.

Specifically, as shown in FIG. 14, the functional portion EL in areas D21 and D22 of FIG. 12 may be configured as follows. Referring to FIG. 14, in area D21 of FIG. 13, in which the first emissive portion EA1 is enlarged, three common layers HTL, ETL, and EIL and a first color emissive layer REML2 are provided between the charge generation layer OL and the cathode CAT.

In area D22 of FIG. 13, in which the trench T of the bank BK is enlarged, three common layers HTL, ETL, and EIL and a stack of layers P2 including a first auxiliary color emissive layer REML2', a second auxiliary color emissive layer GEML2', and a third auxiliary color emissive layer BEML2' are provided between the charge generation layer OL and the cathode CAT.

Meanwhile, a first common layer CML1' on the anode AND further includes a lower first color emissive layer REML1, compared to the first common layer CML1 on the bank BK.

Compared to the first emissive portion EA1, therefore, a second auxiliary color emissive layer GEML2' and a third auxiliary color emissive layer BEML2' having different colors from the first emissive portion EA1 are further provided at the trench T as the stack of layers P2. That is, the first vertical distance L21 from the lower surface of the cathode CAT to the lower surface of the stack of layers P2 on the bank BK may be greater than the second vertical distance L22 from the lower surface of the cathode CAT to the lower surface of the first color emissive layer REML2 in the first emissive portion EA1. Consequently, the stack of layers P2 may electrically space the first common layer CGL and the cathode CAT in the functional portion EL apart from each other at the trench T vulnerable to deposition, whereby it is possible to prevent short circuit between the first common layer CML1 and the cathode CAT.

In addition, the stack of layers P2 according to the second embodiment may further include an auxiliary color emissive layer, whereby the first vertical distance L21 may be increased, compared to the stack of layers P1 according to the first embodiment. In the stack of layers P2 according to the second embodiment, therefore, it is possible to further increase the vertical distance between the first common layer CML1 and the cathode CAT, compared to the first embodiment. As an example, the second embodiment of the present disclosure may be more effective when the shadow area of the structure is wide.

Figure 15:
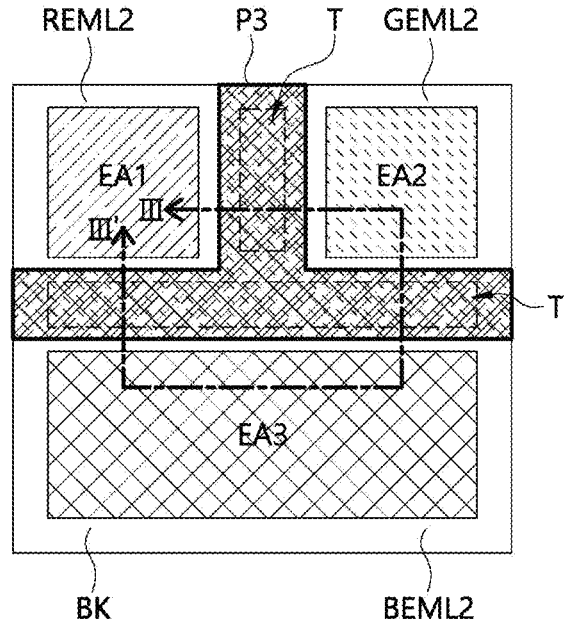
FIG. 15 is a plan view of a light emitting display device according to a third embodiment of the present disclosure.
Figure 16:
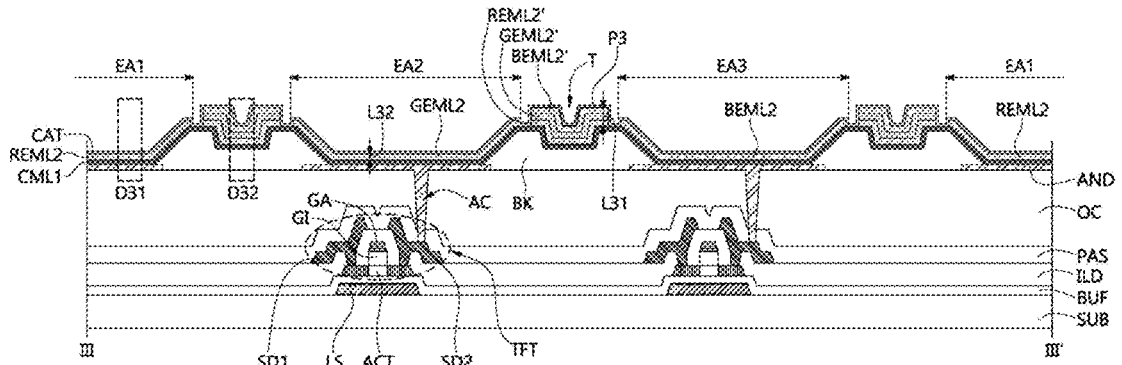
FIG. 16 is a sectional view taken along line III-III' of FIG. 15.
Figure 17:
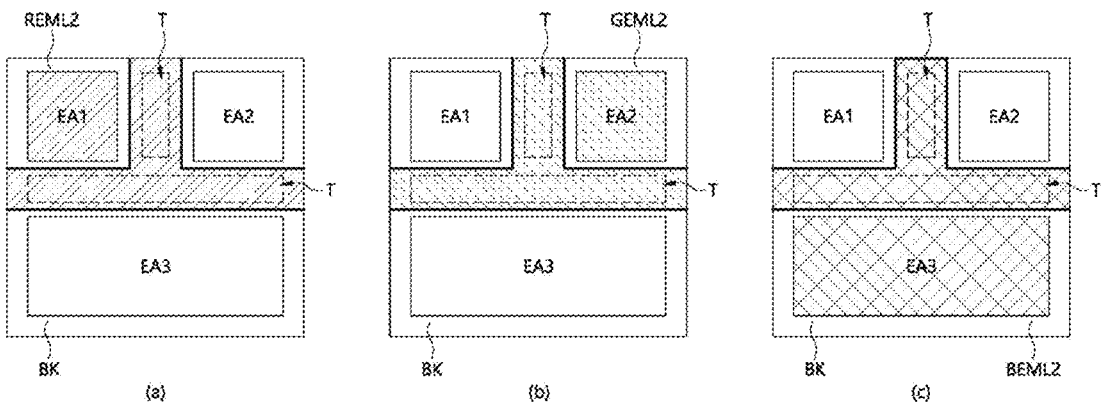
FIG. 17 is a view showing an area of each color emissive layer of FIG. 15.

FIG. 15 is a plan view of a light emitting display device according to a third embodiment of the present disclosure, FIG. 16 is a sectional view taken along line III-III' of FIG. 15, and FIG. 17 is a view showing an area of each color emissive layer of FIG. 15. In the third embodiment, a stack of layers P3 is constituted by three auxiliary color emissive layers, and may be independent of an upper color emissive layer of an emissive portion adjacent thereto. That is, the stack of layers P3 according to the third embodiment may be provided on the upper surface of a bank BK in the form of an island. A description of the construction of this embodiment identical to the constructions of the previous embodiments will be omitted, and a hole transport layer HTL2 and a second common layer CML2 on a first common layer CML1 of a functional portion EL between an anode AND and a cathode CAT are omitted from FIG. 16.

In the third embodiment of the present disclosure, most of an organic material source is deposited on a trench T in a vertical direction, whereby the organic material is uniformly deposited on the bottom surface and the side surface of the trench T, compared to the first embodiment. However, the third embodiment is not limited to FIG. 16, and most of the organic material source may be deposited on the trench T in a lateral direction, whereby the organic material may be thinly deposited on the bottom surface and the side surface of the trench T in a shadow area.

Also, in the third embodiment of the present disclosure, the stack of layers P3 of the light emitting display device according to the third embodiment of the present disclosure has a layered structure of a first auxiliary color emissive layer REML2', a second auxiliary color emissive layer GEML2', and a third auxiliary color emissive layer BEML2', and is discontinuous with first to third emissive portions EA1, EA2, and EA3, compared to the first and second embodiments.

Referring to FIGS. 15 and 17, the first color emissive layer REML2 may be configured to cover the first emissive portion EA1 and a trench T of a bank BK. In addition, the second color emissive layer GEML2 may be configured to cover the second emissive portion EA2 and the trench T of the bank BK, and the third color emissive layer BEML2 may be configured to cover the third emissive portion EA3 and the trench T of the bank BK. Consequently, the first to third color emissive layers REML2, GEML2, and BEML2 may overlap each other at the trench T to constitute a stack of layers P3.

That is, the first to third color emissive layers REML2, GEML2, and BEML2 are not deposited in the area other than the first to third emissive portions EA1, EA2, and EA3 and the stack of layers P3. Consequently, each of the first to third color emissive layers REML2, GEML2, and BEML2 may be discontinuous between a corresponding one of the first to third emissive portions EA1, EA2, and EA3 and the stack of layers P3.

The first color emissive layer REML2, the second color emissive layer GEML2, and the third color emissive layer BEML2 of the stack of layers P3 may be defined as a first auxiliary color emissive layer REML2', a second auxiliary color emissive layer GEML2', and a third auxiliary color emissive layer BEML2', respectively.

That is, the stack of layers P3 according to this embodiment has a structure in which the first auxiliary color emissive layer REML2', the second auxiliary color emissive layer GEML2', and the third auxiliary color emissive layer BEML2' are layered, and the stack of layers P3 is discontinuous with the first color emissive layer REML2, the second color emissive layer GEML2, and the third color emissive layer BEML2 of the first to third emissive portions EA1, EA2, and EA3.

The first to third color emissive layers REML2, GEML2, and BEML2 may extend to the side surface of the bank BK and the edge of the upper surface of the bank BK on the anode AND between the banks BK. However, the first to third color emissive layers REML2, GEML2, and BEML2 according to this embodiment may be discontinuous with the stack of layers P3 at the edge of the upper surface of the bank BK.

Referring to FIG. 16, the same stack of layers P3 may be provided between the emissive portions EA1, EA2, and EA3. Here, the third auxiliary color emissive layer BEML2' of the stack of layers P3 may be located on the bottom surface and the side surface of the trench T and the upper surface of the bank BK while contacting the first auxiliary color emissive layer REML2' or the second auxiliary color emissive layer GEML2' according to the manufacturing order; however, the present disclosure is not limited thereto.

The first vertical distance L31 from the lower surface of the cathode CAT to the lower surface of the stack of layers P3 at the upper surface of the bank BK may be greater than the second vertical distance L32 to the lower surface of the upper color emissive layer in the emissive portion. Consequently, the stack of layers P3 may electrically space the first common layer CGL and the cathode CAT in the functional portion EL apart from each other at the trench T vulnerable to deposition, whereby it is possible to prevent short circuit between the first common layer CML1 and the cathode CAT.

Figure 18:
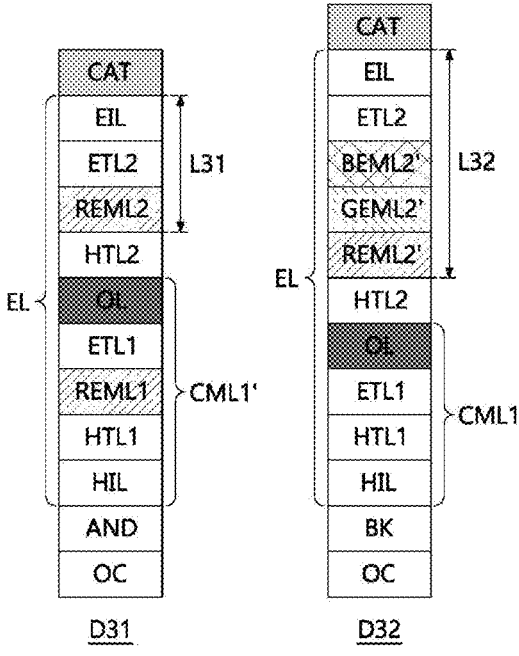
FIG. 18 is a sectional view showing layered structures of areas D31 and D32 of FIG. 16.

FIG. 18 is a sectional view showing layered structures of areas D31 and D32 of FIG. 16.

Referring to FIG. 18, in area D31 of FIG. 16, in which first emissive portion EA1 is enlarged, three common layers HTL, ETL, and EIL and a first color emissive layer REML2 are provided between the charge generation layer OL and the cathode CAT.

In area D32 of FIG. 16, in which the trench T of the bank BK is enlarged, three common layers HTL, ETL, and EIL and a stack of layers P3 including a first auxiliary color emissive layer REML2', a second auxiliary color emissive layer GEML2', and a third auxiliary color emissive layer BEML2' are provided between the charge generation layer OL and the cathode CAT.

Meanwhile, a first common layer CML1' on the anode AND further includes a lower first color emissive layer REML1, compared to the first common layer CML1 on the bank BK.

Compared to the first emissive portion EA1, therefore, a second auxiliary color emissive layer GEML2' and a third auxiliary color emissive layer BEML2' having different colors from the first emissive portion EA1 are further provided at the trench T as the stack of layers P3. That is, the first vertical distance L31 from the lower surface of the cathode CAT to the lower surface of the stack of layers P3 on the bank BK may be greater than the second vertical distance L32 from the lower surface of the cathode CAT to the lower surface of the first color emissive layer REML2 in the first emissive portion EA1. Consequently, the stack of layers P3 may electrically space the first common layer CGL and the cathode CAT in the functional portion EL apart from each other at the trench T vulnerable to deposition, whereby it is possible to prevent short circuit between the first common layer CML1 and the cathode CAT.

FIGS. 19A to 19E are sectional views showing a process of manufacturing the light emitting display device according to the second embodiment of the present disclosure. A hole transport layer HTL2 and a second common layer CML2 on a first common layer CML1 of a functional portion EL between an anode AND and a cathode CAT are omitted from FIGS. 19A to 19E.

Figure 19A:
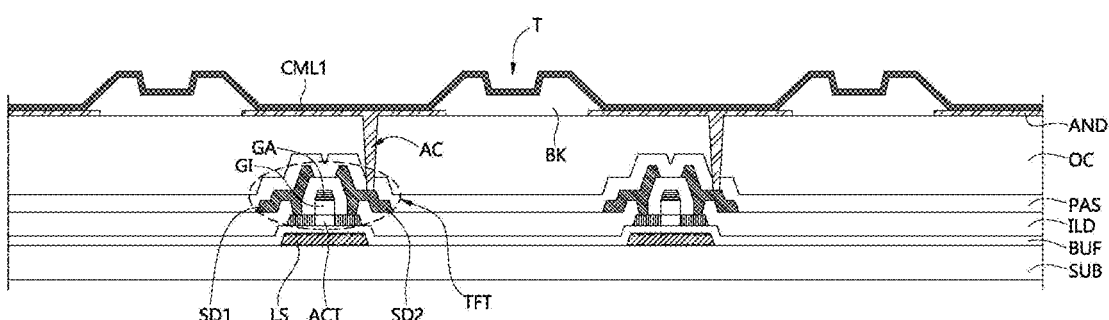
FIGS. 19A to 19E are sectional views showing a process of manufacturing the light emitting display device according to the second embodiment of the present disclosure.

Referring to FIG. 19A, a shielding layer LS, a buffer film BUF, and a thin film transistor TFT are sequentially formed on a substrate SUB. Specifically, a buffer film BUF is formed on a substrate SUB having a shielding layer LS formed thereon, and an active layer ACT is formed on the buffer film BUF through a mask process. Subsequently, a gate insulation film GI is formed on the buffer film BUF having the active layer ACT formed thereon, and a gate electrode GA is formed on the gate insulation film GI. The gate insulation film GI and the gate electrode GA are simultaneously formed through a mask process. Subsequently, an interlayer dielectric ILD having source and drain contact holes is formed on the gate electrode GA through a mask process. Subsequently, source and drain electrodes SD1 and SD2 are formed on the substrate SUB having the interlayer dielectric ILD formed thereon through a mask process. Subsequently, a passivation layer PAS having an anode contact hole AC and an overcoat layer OC are sequentially layered on the interlayer dielectric ILD having the source and drain electrodes SD1 and SD2 formed thereon.

Subsequently, an anode AND electrically connected to the drain electrode SD2 through the anode contact hole AC is formed on the overcoat layer OC, and a bank BK including a trench T is formed on the overcoat layer OC. A first common layer CML1 is formed on the on the overcoat layer OC and the bank BK including the trench T. The side surface of the trench T of the bank BK may be steeper than the side surface of the bank BK in order to increase a current movement path.

Figure 19B:
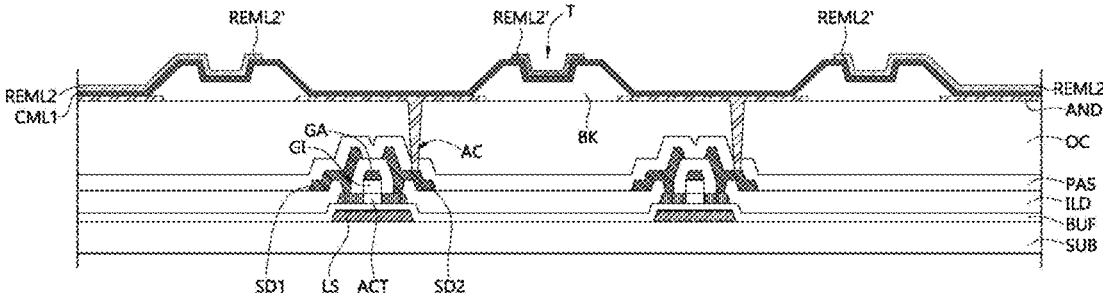

Next, referring to FIG. 19B, a first color emissive layer REML2 and a first auxiliary color emissive layer REML2' may be formed on the first common layer CML1 using a mask. The first color emissive layer REML2 may be formed in a first emissive portion EA1, and the first auxiliary color emissive layer REML2' may extend to the upper surface of the bank BK while covering the bottom surface and the side surface of the trench T of the bank BK.

An opening of the mask that forms the first color emissive layer REML2 and the first auxiliary color emissive layer REML2' continuously has the first color emissive layer REML2 and the first auxiliary color emissive layer REML2'. Consequently, the first auxiliary color emissive layer REML2' adjacent to the first emissive portion EA1 may be continuous with the first color emissive layer REML2 of the first emissive portion EA1. In addition, the first auxiliary color emissive layer REML2' may be made of the same material as the first color emissive layer REML2 while having the same color as the first color emissive layer REML2.

Figure 19C:
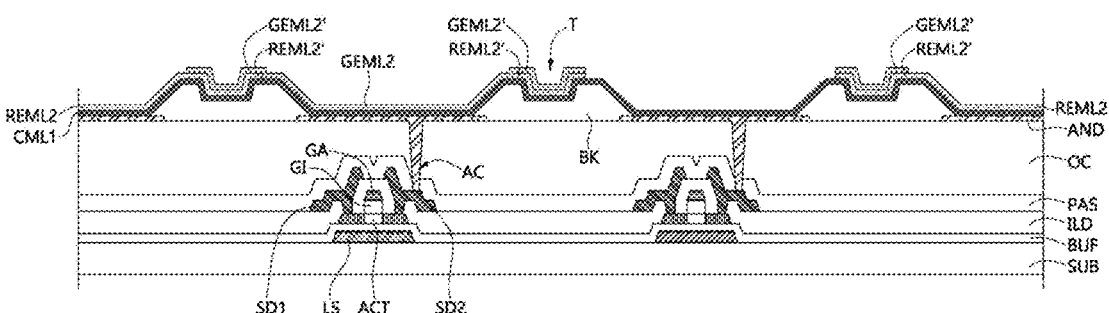

Next, referring to FIG. 19C, a second color emissive layer GEML2 and a second auxiliary color emissive layer GEML2' may be formed on the substrate SUB having the first color emissive layer REML2 and the first auxiliary color emissive layer REML2' formed thereon using a mask. The second color emissive layer GEML2 may be formed in a second emissive portion EA2, and the second auxiliary color emissive layer GEML2' may extend to the upper surface of the bank BK while covering the trench T of the bank BK.

An opening of the mask that forms the second color emissive layer GEML2 and the second auxiliary color emissive layer GEML2' continuously has the second color emissive layer GEML2 and the second auxiliary color emissive layer GEML2'. Consequently, the second auxiliary color emissive layer GEML2' adjacent to the second emissive portion EA2 may be continuous with the second color emissive layer GEML2. In addition, the second auxiliary color emissive layer GEML2' may be made of the same material as the second color emissive layer GEML2 while having the same color as the second color emissive layer GEML2.

Figure 19D:
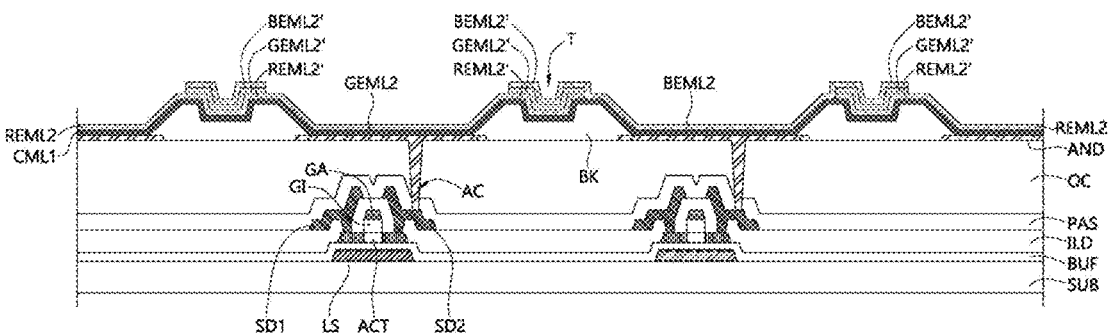

Next, referring to FIG. 19D, a third color emissive layer BEML2 and a third auxiliary color emissive layer BEML2' may be formed on the substrate SUB having the second color emissive layer GEML2 and the second auxiliary color emissive layer GEML2' formed thereon using a mask. The third color emissive layer BEML2 may be formed in a third emissive portion EA3, and the third auxiliary color emissive layer BEML2' may extend to the upper surface of the bank BK while covering the trench T of the bank BK.

An opening of the mask that forms the third color emissive layer BEML2 and the third auxiliary color emissive layer BEML2' continuously has the third color emissive layer BEML2 and the third auxiliary color emissive layer BEML2'. Consequently, the third auxiliary color emissive layer BEML2' adjacent to the third emissive portion EA3 may be continuous with the third color emissive layer BEML2 of the third emissive portion EA3. In addition, the third auxiliary color emissive layer BEML2' may be made of the same material as the third color emissive layer BEML2 while having the same color as the third color emissive layer BEML2.

Figure 19E:
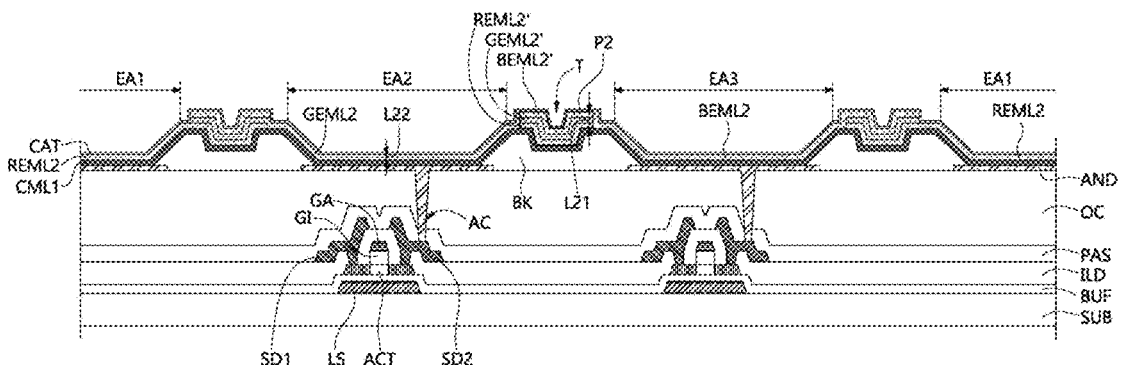

Next, referring to FIG. 19E, a cathode CAT is formed on the substrate SUB having the third color emissive layer BEML2 and the third auxiliary color emissive layer BEML2' formed thereon.

In the present disclosure, therefore, a stack of layers P2 having a structure in which the first to third auxiliary color emissive layers REML2', GEML2', and BEML2' are layered may be provided. Here, a second auxiliary color emissive layer GEML2' and a third auxiliary color emissive layer BEML2' having different colors from the first color emissive layer REML2 of the first emissive portion EA1 are further provided at the trench T as the stack of layers P2, compared to the first emissive portion EA1.

In addition, the first vertical distance L21 from the lower surface of the cathode CAT to the lower surface of the stack of layers P2 on the bank BK may be greater than the second vertical distance L22 from the lower surface of the cathode CAT to the lower surface of the first color emissive layer REML2 in the first emissive portion EA1. Consequently, the stack of layers P2 may electrically space the first common layer CGL and the cathode CAT in the functional portion EL apart from each other at the trench T vulnerable to deposition, whereby it is possible to prevent short circuit between the first common layer CML1 and the cathode CAT.

The mask that forms the stack of layers P2 may be the same as a mask that forms an upper color emissive layer of an emissive portion adjacent thereto. In addition, during formation of an emissive layer, the area of an opening of a deposition mask may be increased to the bank BK adjacent thereto, rather than to the area of an emissive portion required for each subpixel, whereby it is possible to prevent short circuit between the cathode CAT and a layer having high charge mobility through only change in shape of the opening of the mask that forms the emissive layer without an additional mask. That is, in the present disclosure, no additional mask is used to form the stack of layers P2, and a conventional mask that forms the upper color emissive layer is also used. In the present disclosure, therefore, an additional mask for forming the stack of layers P2 is not necessary to prevent short circuit between the first common layer CML1 and the cathode CAT, and an additional process is not added.

Next, a fourth embodiment and a fifth embodiment of the present disclosure will be described with reference to FIG. 1.

Referring to FIG. 1, a stack of layers of the light emitting display device according to the fourth embodiment of the present disclosure may be provided at only a part of an active area, incident from a source at a small acute angle during deposition of a common layer, adjacent to an outer area line. Specifically, any one of the stack of layers P1, P2, and P3 according to the first to third embodiments of the present disclosure may be located at the active area AA adjacent to the outer line area OLA. No stack of layers may be formed in the active area AA adjacent to the central area CA. As an example, in the fourth embodiment of the present disclosure, the active area AA adjacent to the central area CA may be formed as shown in FIG. 3B.

In the fourth embodiment of the present disclosure, therefore, any one of the stack of layers P1, P2, and P3 is formed at the outer line area OLA vulnerable to deposition, whereby short circuit between the first common layer CML1 and the cathode CAT is prevented.

Referring to FIG. 1, a stack of layers of the light emitting display device according to the fifth embodiment of the present disclosure may be provided on a bank in the entirety of an active area. Specifically, any one of the stack of layers P1, P2, and P3 according to the first to third embodiments of the present disclosure may be located in the entirety of the active area AA of the outer line area OLA and the central area CA. That is, the stack of layers P1, P2, or P3 according to the fifth embodiment of the present disclosure may be formed in the entirety of the active area AA on the substrate MG.

Due to the source deposition angle of the organic material, however, the stack of layers P1, P2, or P3 located in the active area AA of the outer line area OLA is thinly deposited on the side surface and the bottom surface of the trench T, and the stack of layers P1, P2, or P3 located in the active area AA of the central area CA is relatively uniformly deposited on the side surface and the bottom surface of the trench T.

In the fifth embodiment of the present disclosure, therefore, any one of the stack of layers P1, P2, and P3 is formed at the central area CA excluding the outer line area OLA vulnerable to deposition, whereby the first common layer CML1 and the cathode CAT may be electrically spaced apart from each other on the bank BK over the entire area of the substrate MG.

Consequently, the light emitting display device according to the present disclosure has an effect in that the stack of layers is formed at the trench of the bank, whereby the first common layer and the cathode are electrically spaced apart from each other, and therefore it is possible to prevent short circuit between the first common layer and the cathode.

In addition, the light emitting display device according to the present disclosure has an effect in that the stack of layers on the trench is formed using the same mask as the color emissive layer on the emissive portion, whereby a separate mask is not necessary, and therefore separate cost for forming the stack of layers is not incurred.

The light emitting display device according to the present disclosure may be configured as follows.

A light emitting display device according to an embodiment of the present disclosure may include a substrate, a bank provided on the substrate, the bank being configured to divide a first emissive portion and a second emissive portion from each other, the bank having a trench formed in the surface thereof, a first common layer provided over the first emissive portion, the bank, and the second emissive portion, a first color emissive layer provided on the first common layer in the first emissive portion, a second color emissive layer provided on the first common layer in the second emissive portion, a stack of layers formed by overlapping of a first auxiliary color emissive layer provided on the same layer as the first color emissive layer and a second auxiliary color emissive layer provided on the same layer as the second color emissive layer on the bank including the trench, and a cathode electrically spaced apart from the first common layer by the stack of layers.

In the light emitting display device according to the embodiment of the present disclosure, the first auxiliary color emissive layer and the second auxiliary color emissive layer of the stack of layers may contact each other.

In the light emitting display device according to the embodiment of the present disclosure, the first vertical distance from the lower surface of the cathode to the lower surface of the stack of layers on the bank may be greater than the second vertical distance from the lower surface of the cathode to the lower surface of the first color emissive layer in the first emissive portion.

In the light emitting display device according to the embodiment of the present disclosure, the first common layer may include a first stack and a charge generation layer, the first stack may include at least one hole transport layer and at least one electron transport layer, and the charge generation layer may have higher charge mobility than the at least one hole transport layer and the at least one electron transport layer.

In the light emitting display device according to the embodiment of the present disclosure, each of the first emissive portion and the second emissive portion may include an anode, the first common layer may be located between the anode and the cathode, and each of the first emissive portion and the second emissive portion may further include at least one emissive layer in the first stack.

In the light emitting display device according to the embodiment of the present disclosure, the at least one emissive layer included in the first stack of the first emissive portion may include an emissive layer having the same color as the first color emissive layer, and the at least one emissive layer included in the first stack of the second emissive portion may include an emissive layer having the same color as the second color emissive layer.

In the light emitting display device according to the embodiment of the present disclosure, each of the first emissive portion and the second emissive portion may include at least one second common layer provided on a corresponding one of the first color emissive layer and the second color emissive layer, and the second common layer may be located between the stack of layers and the cathode on the bank, the second common layer being continuous at the first emissive portion, the bank, and the second emissive portion.

In the light emitting display device according to the embodiment of the present disclosure, the first color emissive layer may be a blue emissive layer, and the second color emissive layer may be a red emissive layer or a green emissive layer.

In the light emitting display device according to the embodiment of the present disclosure, the stack of layers may be continuous at the bottom surface and the side surface of the trench and the upper surface of the bank.

In the light emitting display device according to the embodiment of the present disclosure, the stack of layers may further include a third auxiliary color emissive layer, wherein the third auxiliary color emissive layer may overlap the first auxiliary color emissive layer and the second auxiliary color emissive layer and may contact the first auxiliary color emissive layer or the second auxiliary color emissive layer.

In the light emitting display device according to the embodiment of the present disclosure, a third emissive portion adjacent to at least one of the first emissive portion and the second emissive portion may be further included, wherein the third emissive portion may include a third color emissive layer provided on the same layer as the third auxiliary color emissive layer.

In the light emitting display device according to the embodiment of the present disclosure, each of the first color emissive layer and the second color emissive layer may be continuous with a corresponding one of the first auxiliary color emissive layer and the second auxiliary color emissive layer adjacent thereto.

In the light emitting display device according to the embodiment of the present disclosure, at least one of the first color emissive layer and the second color emissive layer may be discontinuous with the stack of layers.

As is apparent from the above description, the light emitting display device according to the present disclosure has the following effects.

The light emitting display device according to the present disclosure has an effect in that the stack of layers is formed at the trench of the bank, whereby the first common layer and the cathode are electrically spaced apart from each other, and therefore it is possible to prevent short circuit between the first common layer and the cathode.

In addition, the light emitting display device according to the present disclosure has an effect in that the stack of layers on the trench is formed using the same mask as the color emissive layer on the emissive portion, whereby a separate mask is not necessary, and therefore separate cost for forming the stack of layers is not incurred.

The present disclosure is not limited to the above embodiments and the accompanying drawings, and those skilled in the art to which the present disclosure pertains will understand that various substitutions, modifications, and alterations are possible without deviating from the technical details of the present disclosure. Therefore, the scope of the present disclosure is defined by the appended claims, and it should be interpreted that all alterations or modifications derived from the meaning and scope of the claims and equivalent concepts thereto are included in the scope of the present disclosure.

The invention claimed is:

1. A light emitting display device comprising:
a substrate;
a bank on the substrate, the bank having a trench in the substrate;
a first emissive portion separated from a second emissive portion by the bank;
a first common layer on the first emissive portion, the bank, and the second emissive portion;
a first color emissive layer on the first common layer in the first emissive portion;
a second color emissive layer on the first common layer in the second emissive portion;
a stack of layers including:
a first auxiliary color emissive layer in the trench in the bank; and
a second auxiliary color emissive layer in the trench in the bank.

2. The light emitting display device according to claim 1, comprising a cathode on the first emissive portion, the bank, and the second emissive portion, the cathode electrically spaced from the first common layer by the stack of layers.

3. The light emitting display device according to claim 2, wherein the first auxiliary color emissive layer and the second auxiliary color emissive layer of the stack of layers contact each other.

4. The light emitting display device according to claim 2, wherein a first vertical distance from a lower surface of the cathode to a lower surface of the stack of layers on the bank is greater than a second vertical distance from the lower surface of the cathode to a lower surface of the first color emissive layer in the first emissive portion.

5. The light emitting display device according to claim 2, wherein
the first common layer comprises a first stack and a charge generation layer,
the first stack comprises at least one hole transport layer and at least one electron transport layer, and
the charge generation layer has higher charge mobility than the at least one hole transport layer and the at least one electron transport layer.

6. The light emitting display device according to claim 5, wherein
each of the first emissive portion and the second emissive portion comprises an anode,
the first common layer is located between the anode and the cathode, and each of the first emissive portion and the second emissive portion further comprises at least one emissive layer in the first stack.

7. The light emitting display device according to claim 6, wherein
the at least one emissive layer included in the first stack of the first emissive portion comprises an emissive layer having the same color as the first color emissive layer, and
the at least one emissive layer included in the first stack of the second emissive portion comprises an emissive layer having the same color as the second color emissive layer.

8. The light emitting display device according to claim 5, wherein
each of the first emissive portion and the second emissive portion comprises at least one second common layer on a corresponding one of the first color emissive layer and the second color emissive layer, and
the second common layer is located between the stack of layers and the cathode on the bank, the second common layer being continuous at the first emissive portion, the bank, and the second emissive portion.

9. The light emitting display device according to claim 1, wherein
the first color emissive layer is a blue emissive layer, and
the second color emissive layer is a red emissive layer or a green emissive layer.

10. The light emitting display device according to claim 1, wherein the stack of layers is continuous at a bottom surface and a side surface of the trench and an upper surface of the bank.

11. The light emitting display device according to claim 1, wherein each of the first color emissive layer and the second color emissive layer is continuous with a corresponding one of the first auxiliary color emissive layer and the second auxiliary color emissive layer adjacent thereto.

12. The light emitting display device according to claim 1, wherein at least one of the first color emissive layer and the second color emissive layer is discontinuous with the stack of layers.

13. A device, comprising:
a substrate;
a first emissive portion on the substrate;
a second emissive portion on the substrate;
a bank between the first emissive portion and the second emissive portion, the bank including a trench;
a first emissive layer of a first color in the first emissive portion;
a second emissive layer of a second color in the second emissive portion;
a third emissive layer of the first color in the trench;
a fourth emissive layer of the second color in the trench.

14. The device of claim 13 wherein the first emissive layer is spaced from the substrate by a first dimension in a first direction and the third emissive layer is spaced from the substrate by a second dimension in the first direction, the first dimension being smaller than the second dimension.

15. The device of claim 13, comprising a fifth emissive layer of a third color in the trench.

16. The device of claim 15 wherein the fourth emissive layer in direct contact with the third emissive layer.

17. The device of claim 16 wherein the fifth emissive layer is in direct contact with the fourth emissive layer.

18. A device, comprising:
a substrate;
a bank in the substrate;

a trench in the bank;

a first emissive portion in the substrate;

a second emissive portion in the substrate, the first emissive portion being spaced from the second emissive portion by the bank and the trench;

a first emissive layer of a first color on the first emissive portion;

a second emissive layer of a second color on the second emissive portion;

a stack of a plurality of emissive layers on the bank and in the trench, the stack of the plurality of emissive layers including at least one layer of the first color.

19. The device of claim 18 wherein the stack of the plurality of emissive layers includes at least one layer of the second color.

20. The device of claim 19 wherein the stack of the plurality of emissive layers includes at least one layer of a third color that is different from the first color and the second color.

21. A device, comprising:

a substrate;

a first emissive portion on the substrate;

a second emissive portion on the substrate;

a third emissive portion on the substrate;

a bank having a first trench that separates the first emissive portion from the second emissive portion along a first direction, the bank having a second trench that separates the first emissive portion from the third emissive portion along a second direction that is transverse to the first direction, the second trench separates the second emissive portion from the third emissive portion along the second direction;

a first area that includes the first emissive portion, all of first trench, and a first part of the second trench;

a second area that includes the second emissive portion, all of the first trench, and a second part of the second trench that overlaps the first part of the second trench;

a third area that includes the third emissive portion and all of the second trench;

a first emissive layer overlapping the first area;

a second emissive layer overlapping the second area; and a third emissive layer overlapping the third area.

22. The device of claim 21 wherein the first trench has a first dimension along the second direction and the second trench has a second dimension along the first direction, the first dimension being less than the second dimension.

23. The device of claim 22 wherein the first emissive portion has a third dimension along the first direction and the second emissive portion has a fourth dimension along the first direction, the second dimension being greater than the third dimension, and the second dimension being greater than the fourth dimension.

24. The device of claim 23 wherein the third emissive portion includes a fifth dimension along the first direction, the fifth dimension being substantially similar to the second dimension.

* * * * *